US010741243B2

(12) United States Patent
Mirichigni et al.

(10) Patent No.: US 10,741,243 B2
(45) Date of Patent: Aug. 11, 2020

(54) AUTO-REFERENCED MEMORY CELL READ TECHNIQUES

(71) Applicant: Micron Technology, Inc., Boise, ID (US)

(72) Inventors: Graziano Mirichigni, Vimercate (IT); Marco Sforzin, Cernusco Sul Naviglio (IT); Alessandro Orlando, Naples (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/729,061

(22) Filed: Dec. 27, 2019

(65) Prior Publication Data

US 2020/0211641 A1 Jul. 2, 2020

Related U.S. Application Data

(62) Division of application No. 15/853,328, filed on Dec. 22, 2017, now Pat. No. 10,566,052.

(51) Int. Cl.
*G11C 11/22* (2006.01)
*G11C 11/56* (2006.01)
(Continued)

(52) U.S. Cl.
CPC ............ *G11C 11/5642* (2013.01); *G11C 7/14* (2013.01); *G11C 8/14* (2013.01); *G11C 13/003* (2013.01);
(Continued)

(58) Field of Classification Search
CPC ...................................................... G11C 11/22
(Continued)

(56) References Cited

U.S. PATENT DOCUMENTS

| 7,054,197 B2 | 5/2006 | Vimercati |
| 7,321,512 B2 | 1/2008 | Vimercati et al. |

(Continued)

FOREIGN PATENT DOCUMENTS

WO 2013033375 A1 3/2013

OTHER PUBLICATIONS

IPO, "Office Action," issued in connection with ROC (Taiwan) Pat. App. No. 107146309, dated Jul. 11, 2019 (6 pages).
(Continued)

*Primary Examiner* — Jason Lappas
(74) *Attorney, Agent, or Firm* — Holland & Hart LLP

(57) ABSTRACT

Methods, systems, and devices related to auto-referenced memory cell read techniques are described. The auto-referenced read may encode user data to include a certain number bits having a first logic state prior to storing the user data in memory cells. Subsequently, reading the encoded user data may be carried out by applying a read voltage to the memory cells while monitoring a series of switching events by activating a subset of the memory cells having the first logic state. The auto-referenced read may identify a particular switching event that correlates to a median threshold voltage value of the subset of the memory cells. Then, the auto-referenced read may determine a reference voltage that takes into account a statistical property of threshold voltage distribution of the subset of the memory cells. The auto-referenced read may identify a time duration to maintain the read voltage based on determining the reference voltage. When the time duration expires, the auto-referenced read may determine that the memory cells that have been activated correspond to the first logic state.

20 Claims, 11 Drawing Sheets

(51) Int. Cl.
  *G11C 16/32* (2006.01)
  *G11C 16/30* (2006.01)
  *G11C 8/14* (2006.01)
  *G11C 16/08* (2006.01)
  *G11C 13/00* (2006.01)
  *G11C 7/14* (2006.01)

(52) U.S. Cl.
  CPC ........ *G11C 13/004* (2013.01); *G11C 13/0004* (2013.01); *G11C 16/08* (2013.01); *G11C 16/30* (2013.01); *G11C 16/32* (2013.01); *G11C 11/5678* (2013.01); *G11C 2013/0054* (2013.01); *G11C 2211/5634* (2013.01); *G11C 2213/71* (2013.01); *G11C 2213/76* (2013.01)

(58) Field of Classification Search
  USPC ........................................................ 365/196
  See application file for complete search history.

(56) References Cited

U.S. PATENT DOCUMENTS

| | | | |
|---|---|---|---|
| 7,345,905 | B2 | 3/2008 | Pio et al. |
| 7,554,861 | B2 | 6/2009 | Vimercati et al. |
| 8,767,482 | B2 | 7/2014 | Hirst et al. |
| 9,164,881 | B2 | 10/2015 | Seol et al. |
| 9,460,784 | B1 | 10/2016 | Pellizzer |
| 2004/0190348 | A1 | 9/2004 | Cioaca et al. |
| 2005/0063218 | A1 | 3/2005 | Roohparvar |
| 2005/0078513 | A1 | 4/2005 | Tatsukawa et al. |
| 2006/0155882 | A1 | 7/2006 | Jochemsen et al. |
| 2011/0214025 | A1 | 9/2011 | Seko |
| 2013/0167251 | A1 | 6/2013 | Pio |
| 2014/0173180 | A1 | 6/2014 | D'abreu et al. |
| 2016/0259683 | A1 | 9/2016 | Sakurada |
| 2017/0125097 | A1 | 5/2017 | Tortorelli et al. |
| 2017/0263304 | A1* | 9/2017 | Vimercati ........... G11C 11/2259 |
| 2017/0287541 | A1 | 10/2017 | Vimercati |
| 2017/0358338 | A1 | 12/2017 | Derner et al. |

OTHER PUBLICATIONS

ISA/KR, International Search Report and Written Opinion of the International Searching Authority, Int'l Appl. No. PCT/US2018/066653, Jun. 7, 2019, Korean Intellectual Property Office, Seo-gu, Daejeon, Republic of Korea, 15 pgs.

ISA/KR, International Search Report and Written Opinion of the International Searching Authority, Int'l Appl. No. PCT/US2018/067287, Apr. 12, 2019, Korean Intellectual Property Office, Seo-gu, Daejeon, Republic of Korea, 12 pgs.

U.S. Appl. No. 15/619,158, filed Jun. 9, 2017.

U.S. Appl. No. 15/619,163, filed Jun. 9, 2017.

Vimercati, et al., "A 125MHz Burst-Mode Flexible Read-While-Write 256Mbit 2b/c 1.8V NOR Flash Memory", IEEE International Solid-State Circuits Conference, Digest of Technical Papers, Feb. 7, 2005, (c) IEEE., 3pgs.

* cited by examiner

AUTO-REFERENCED MEMORY CELL READ TECHNIQUES

CROSS REFERENCE

The present Application for Patent is a divisional of and claims priority to and the benefit of U.S. patent application Ser. No. 15/853,328 by Mirichigni et al., entitled "AUTO-REFERENCED MEMORY CELL READ TECHNIQUES," filed Dec. 22, 2017, assigned to the assignee hereof, and is expressly incorporated by reference in its entirety herein.

BACKGROUND

The following relates generally to operating a memory array and more specifically to auto-referenced memory cell read techniques.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. A robust read technique may be desired to increase memory cell performance and reliability when memory cells exhibit variable electrical characteristics.

DETAILED DESCRIPTION

Figure 1:
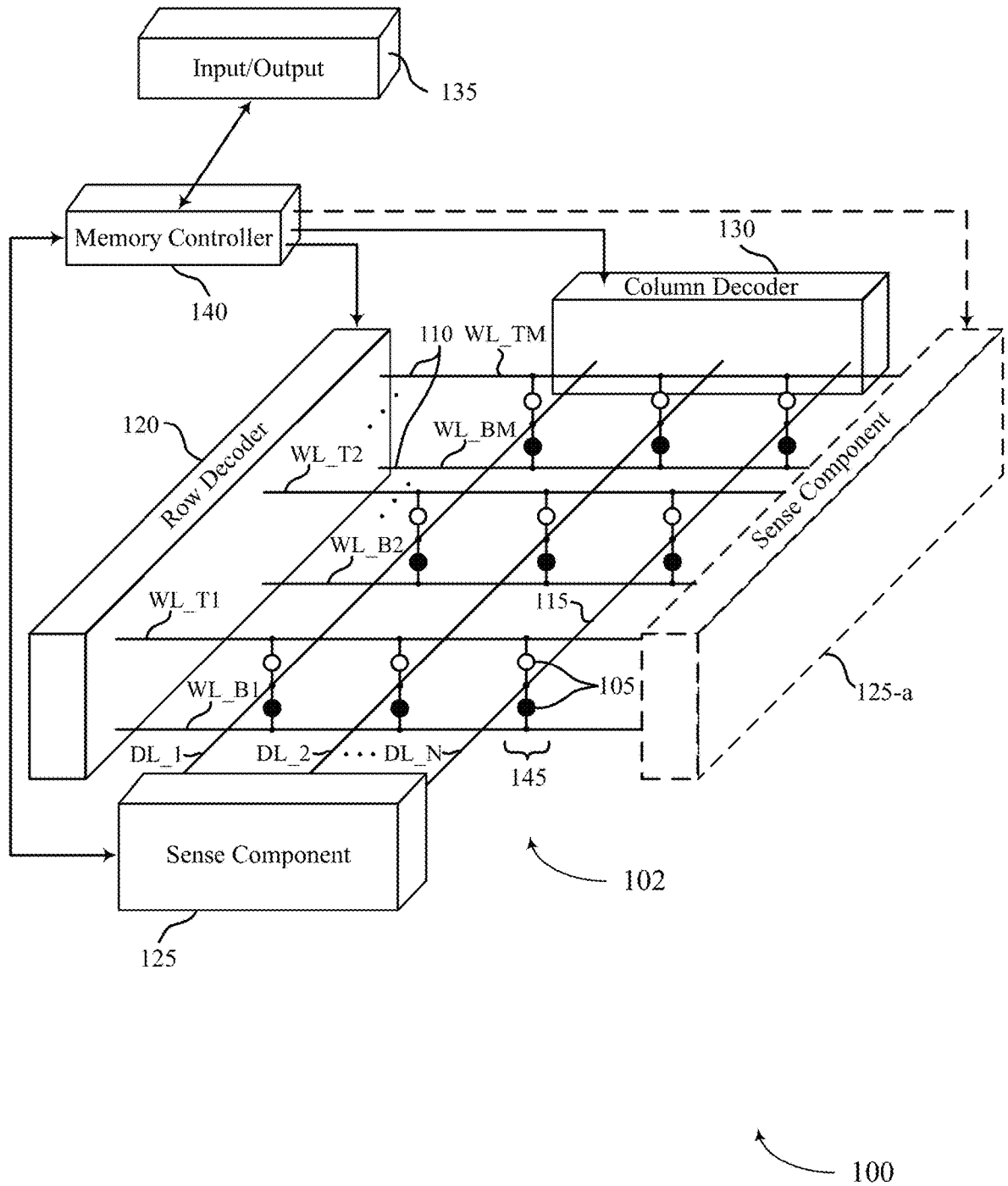
FIG. 1 illustrates an example of a memory device diagram having a three-dimensional (3D) array of memory cells that supports auto-referenced memory cell read techniques in accordance with embodiments of the present disclosure.

A robust read technique may improve performance and reliability of memory cells. In some cases, memory cells exhibit non-uniform, variable electrical characteristics that may originate from various factors including statistical process variations, cycling events (e.g., read or write operations on the memory cells), or a drift (e.g., a change in resistance of a chalcogenide alloy), among others. Auto-referenced memory cell read techniques may provide a reliable and robust read technique in which reading a set of data (e.g., a codeword, a page) is carried out by determining a reference voltage (e.g., $V_{REF}$) that takes into account a statistical property (e.g., a standard deviation of threshold voltages, an estimated median of threshold voltages) of memory cells that store the set of data. In some cases, a memory device may include an array of PCM cells arranged in a 3D architecture, such as 3D XPoint™ (3DXP) to store the set of data. PCM cells in 3DXP architecture (which may also be referred to as 3DXP memory cells) may represent a first logic state (e.g., a logic 1, a SET state) associated with a first set of threshold voltages or a second logic state (e.g., a logic 0, a RESET state) associated with a second set of threshold voltages.

In some cases, the auto-referenced read reduces or eliminates a separate set of read-reference memory cells that may be present in a memory device. The read-reference memory cells may not possess common electrical characteristics with a majority of memory cells in which user data are stored due to various reasons, such as different process conditions (e.g., a non-uniform loading pattern of a plasma density) during fabrication process steps, a different cycling events, among others. Hence, the separate set of read-reference memory cells may not provide a reliable referencing scheme during a read operation.

The auto-referenced read may include an encoding technique that ensures a certain number bits in a user data (e.g., a codeword of 128 bits) to have a given logic state (e.g., a logic state of 1) prior to storing the user data in memory cells (e.g., PCM cells, 3DXP memory cells). In some embodiments, a logic state of 1 (e.g., a SET state of a PCM cell, which may also be referred to as a SET cell or bit) corresponds to a set of threshold voltages lower than a set of threshold voltages associated with a logic state of 0 (e.g., a RESET state of a PCM cell, which may also be referred to as a RESET cell or bit). The encoding technique may provide a number of bits having the logic state of 1 (e.g., the SET bits) within a certain range which may be established by a predetermined factor, k. In some cases, a ratio between a number of bits having the logic state of 1 (e.g., 32 SET bits) and a total number of bits in the user data (e.g., 128 bits) may be referred to as a weight (e.g., 25% weight) or a weight pattern. In some examples, the encoding technique may ensure the encoded user data to have a particular weight within a range of weights (e.g., between 50% and (50+50/k) %) established by the predetermined factor, k. The larger the value of k, the narrower the range may become, which may result in an increased accuracy of the auto-referenced read. Further, the encoding technique may track changes in the user data during the encoding operation by storing k number of bits associated with the encoded user data. The k number of bits, which may also be referred to as flip-bits, may indicate a status of the original user data such that decoding of the encoded user data may be carried out accurately.

The auto-referenced read technique may include application of a voltage (e.g., a read voltage) to a memory array that is configured to activate a group of memory cells containing encoded user data. The voltage may increase as a function of time with a rate that provides a bijective correspondence (e.g., one-to-one correspondence) between a specific voltage value and a specific time. In some embodiments, the read voltage has a constant rate of increase with respect to time. In other embodiments, the read voltage has a monotonically increasing staircase shape such that a first voltage is applied for a first period of time followed by a second different voltage for a second period of time. The applied voltage may initiate a series of switching events by activating the group of memory cells storing the encoded user data. The switching event may be attributed to a memory cell turning on (e.g., conducting an appreciable amount of current) when the applied voltage across the memory cell exceeds its threshold voltage ($V_{TH}$). Hence, initiating the series of switching events in response to the increasing read voltage may be similar to identifying memory cells in an ascending order in terms of their threshold voltage values.

A particular memory cell of the group of memory cells exhibiting a jth switching event may be regarded as having a jth smallest threshold voltage value among the group of memory cells. The auto-referenced read technique may be used to identify that a particular switching event (e.g., a jth switching event) correlates to a median threshold voltage value of memory cells having the logic state of 1 (e.g., SET cells) (e.g., by utilizing statistical properties of a distribution of the threshold voltages). The memory cells that have been activated, including the memory cell that exhibited the jth switching event, may be determined to have the logic state of 1 (e.g., SET cells).

Upon detecting the jth switching event (e.g., the jth memory cell is activated), the auto-referenced read technique may be used to identify a fixed time (e.g., a reference delay time) to maintain application of the read voltage. The applied read voltage may continue to increase during the fixed time to detect additional switching events (e.g., additional memory cells activating). After the fixed time has expired, the additional memory cells that are activated during the fixed time may be determined to have the logic state of 1 (e.g., SET cells, of which Vim values are greater than the particular $V_{TH}$ value of the memory cell that exhibited the jth switching event). The fixed time may be determined by a number of factors including a standard deviation of $V_{TH}$ distribution of the memory cells having the logic state of 1 (e.g., SET cells), the uncertainty factor in identifying the jth memory cell (e.g., the memory cell exhibiting the jth switching event), a margin factor, among others. In some embodiments, when the fixed time expires, the auto-reference read determines that all the memory cells activated by that time are the memory cells having the logic state of 1 (e.g., SET cells). Remaining memory cells of the encoded user data (e.g., the inactive memory cells when the fixed time expires) may be determined to be the memory cells having the logic state of 0 (e.g., RESET cells).

Features of the disclosure introduced above are further described below in the context of memory array in a memory device. Specific non-limiting examples are then described for illustrating various features of the auto-referenced read techniques in accordance with some embodiments (e.g., the memory array including PCM cells or 3DXP memory cells). These and other features of the disclosure are further illustrated by and described with reference to apparatus diagrams, system diagrams, and flowcharts that relate to auto-referenced memory cell read techniques. As a person of ordinary skill in the art would appreciate, however, other alternatives and different variations are specifically contemplated and fall within the scope of this disclosure.

FIG. 1 illustrates an example memory device 100 in accordance with embodiments of the present disclosure. Memory device 100 may also be referred to as an electronic memory apparatus. FIG. 1 is an illustrative representation of various components and features of the memory device 100. As such, it should be appreciated that the components and features of the memory device 100 shown to illustrate functional interrelationships, and may not be representative of their actual physical positions within the memory device 100. In the illustrative example of FIG. 1, the memory device 100 includes a 3D memory array 102. The 3D memory array 102 includes memory cells 105 that may be programmable to store different states. In some embodiments, each memory cell 105 may be programmable to store two states, denoted as a logic 0 and a logic 1. In some embodiments, a memory cell 105 may be configured to store more than two logic states. A memory cell 105 may, in some embodiments, include a PCM cell (e.g., a 3DXP memory cell). Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays formed adjacent one another (e.g., on top of or next to one another). This may increase a number of memory cells 105 that may be placed or created on a single die or substrate as compared with 2D arrays, which in turn may reduce production costs, or increase the performance of the memory device, or both. Based on the example depicted in FIG. 1, memory array 102 includes two levels of memory cells 105 and may thus be considered a 3D memory array; however, the number of levels may not be limited to two. Each level may be aligned or positioned so that memory cells 105 may be aligned (exactly, overlapping, or approximately) with one another across each level, forming a memory cell stack 145. In some cases, the memory cell stack 145 may include a PCM cell (e.g., 3DXP memory cell) laid on top of another.

In some embodiments, each row of memory cells 105 is connected to an access line 110, and each column of memory cells 105 is connected to a bit line 115. Access lines 110 and bit lines 115 may be substantially perpendicular to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. In other embodiments, each of the memory cell 105 (e.g., the upper memory cell, the lower memory cell) may be configured with its own bit line. In such cases, the memory cells may be separated by an insulation layer. Other configurations may be possible, for example, a third layer may share an access line 110 with a lower layer. In general, one memory cell 105 may be located at the intersection of two conductive lines such as an access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized in order to read or write a memory cell 105 at their intersection. Other memory cells 105 that are in electronic communication with (e.g., connected to) the same access line 110 or bit line 115 may be referred to as untargeted memory cells 105.

Figure 2:
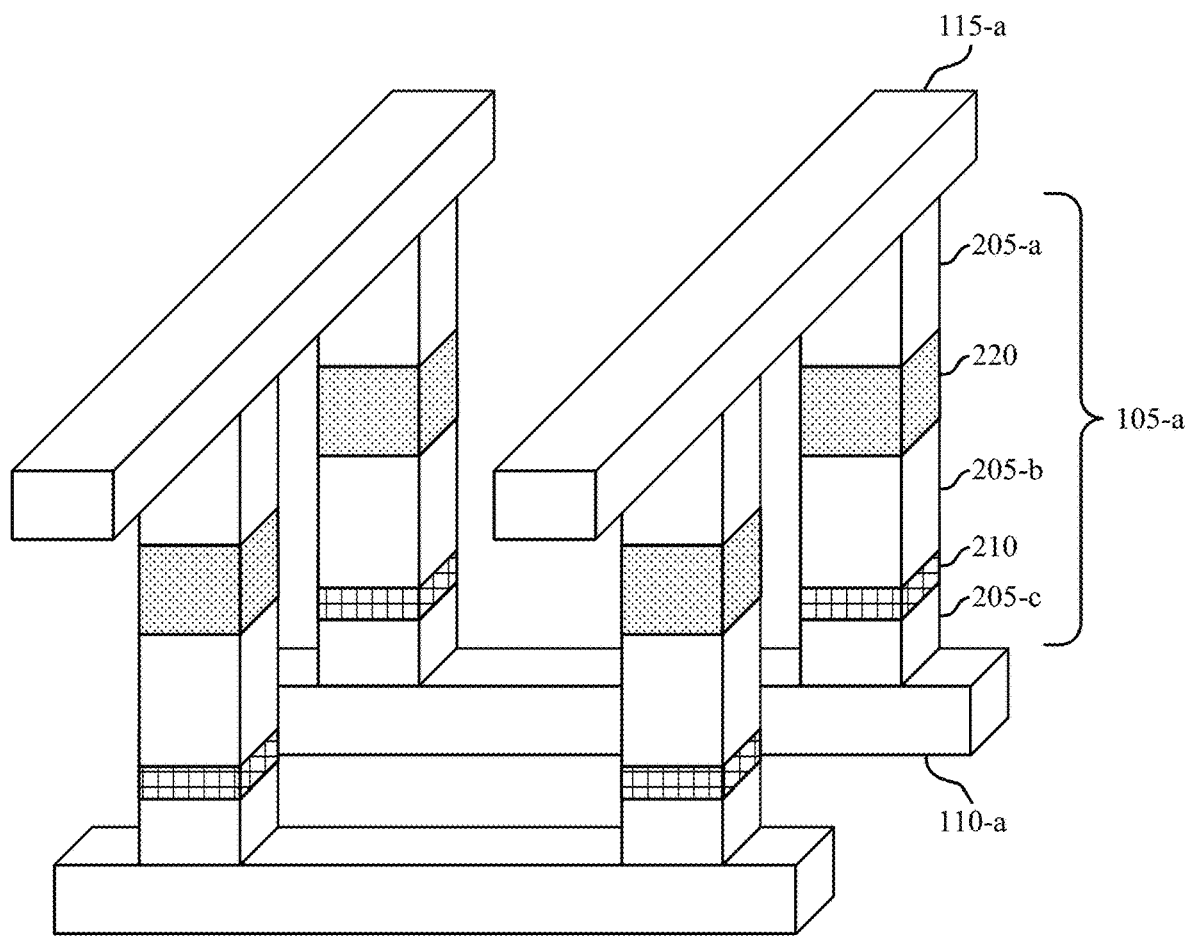
FIG. 2 illustrates an example of a 3D memory array that supports auto-referenced memory cell read techniques in accordance with embodiments of the present disclosure.
Figure 2:
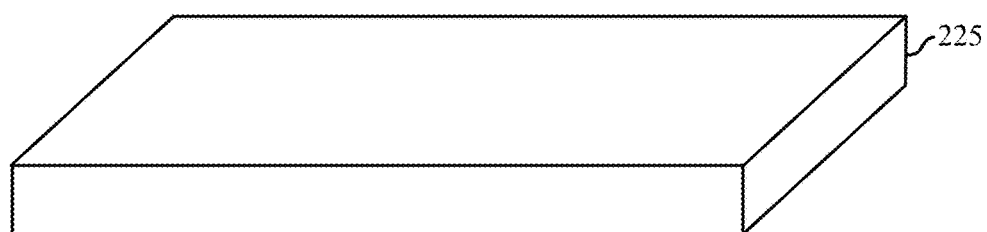

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some embodiments, a memory cell 105 may include a chalcogenide alloy positioned between a first electrode and a second electrode. One side of the first electrode may be coupled to an access line 110 and the other side of the first electrode to the chalcogenide alloy. In addition, one side of the second electrode may be coupled to a bit line 115 and the other side of the second electrode to the chalcogenide alloy. The first electrode and the second electrode may be the same material (e.g., carbon) or different. In other embodiments, the memory cell 105 may include an additional electrode to separate the chalcogenide alloy into two parts as depicted in FIG. 2. A first part of the chalcogenide alloy may have a different composition than a second part of the chalcogenide alloy. In some embodiments, the first part of the chalcogenide alloy may have a different function than the second part of the chalcogenide alloy. The additional electrode may be the same material (e.g., carbon) or different than the first electrode and/or the second electrode.

Operations such as reading and writing may be performed on memory cells 105 by energizing or selecting access line 110 and digit line 115. In some embodiments, access lines 110 may also be known as word lines 110, and bit lines 115 may also be known as digit lines 115. References to word lines and bit lines, or their analogues, are interchangeable without loss of understanding or operation. Energizing or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a memory cell (e.g., a capacitor, a resistor) may be electrically isolated from the digit line by a selection component. The word line 110 may be connected to and may control the selection component. For example, the selection component may be a transistor and the word line 110 may be connected to the gate of the transistor. Energizing the word line 110 results in an electrical connection or closed circuit between the logic storing device of a memory cell 105 and its corresponding digit line 115. The digit line may then be accessed to either read or write the memory cell 105. Upon selecting a memory cell 105, the resulting signal may be used to determine the stored logic state. In some cases, a first logic state may correspond to no current or a negligibly small current, whereas a second logic state may correspond to a finite amount of current. In some cases, a memory cell 105 may include a 3DXP memory cell or a self-selecting memory cell, both having two terminals and may not need a separate selection component. As such, one terminal of the 3DXP memory cell or the self-selecting memory cell may be electrically connected to a word line 110 and the other terminal of the 3DXP memory cell or the self-selecting memory cell may be electrically connected to a digit line 115.

Accessing memory cells 105 may be controlled through a row decoder 120 and a column decoder 130. For example, a row decoder 120 may receive a row address from the memory controller 140 and energize the appropriate word line 110 based on the received row address. Similarly, a column decoder 130 may receive a column address from the memory controller 140 and energize the appropriate digit line 115. For example, memory array 102 may include multiple word lines 110, labeled WL_B1 (or WL_T1) through WL_BM (or WL_TM), and multiple digit lines 115, labeled DL_1 through DL_N, where M and N depend on the array size. Thus, by energizing a word line 110 and a digit line 115, e.g., WL_B2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected (e.g., a memory cell turns on, switches on, conducts current, or becomes activated). In other cases, predetermined voltages may be applied sequentially until a current is detected. Likewise, a current may be applied to a memory cell 105 and the magnitude of the voltage to create the current may depend on the electrical resistance or the threshold voltage of the memory cell 105. In some cases, the memory cell 105 (e.g., a PCM cell) includes a material that changes its crystallographic configuration (e.g., between a crystalline phase and an amorphous phase), which in turn, determines a threshold voltage of the memory cell 105 to store information. In other cases, the memory cell 105 (e.g., a self-selecting memory cell) includes a material that remains in a crystallographic configuration (e.g., an amorphous phase) that may exhibit variable threshold voltages to store information.

Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. FIG. 1 also shows an alternative option of arranging the sense component 125-a (in a dashed box). An ordinary person skilled in the art would appreciate that sense component may be associated either with column decoder or row decoder without losing its functional purposes.

A memory cell 105 may be set or written by similarly energizing the relevant word line 110 and digit line 115 and at least one logic value may be stored in the memory cell 105. Column decoder 130 or row decoder 120 may accept data, for example input/output 135, to be written to the memory cells 105.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, energizing a single word line 110 may result in the discharge of all memory cells in the row; thus, several or all memory cells 105 in the row may need to be re-written. But in non-volatile memory, such as self-selecting memory, PCM (e.g., 3DXP memory), FeRAM, or 3D NAND memory, accessing the memory cell 105 may not destroy the logic state and, thus, the memory cell 105 may not require re-writing after accessing.

The memory controller 140 may control the operation (e.g., read, write, re-write, refresh, discharge) of memory cells 105 through the various components, for example, row decoder 120, column decoder 30, and sense component 125. In some cases, one or more of the row decoder 120, column decoder 130, and sense component 125 may be co-located with the memory controller 140. Memory controller 140 may generate row and column address signals in order to energize the desired word line 110 and digit line 115. Memory controller 140 may also generate and control various voltages or currents used during the operation of memory device 100.

The memory controller 140, in some embodiments, receives user data through the input/output 135 and determines if the user data satisfies a predetermined condition. The predetermined condition may be established in terms of a number of bits having a logic state of 1 (e.g., a SET state of a PCM memory cell) among the bits in the user data. The memory controller 140 may encode the user data to satisfy the predetermined condition prior to storing the user data in memory cells 105. The memory controller 140 may add a certain number of bits to the user data during the encoding operation to track changes made to the user data. As a result of the encoding operation, the encoded user data may be configured to have a number of bits having the logic state of 1 (e.g., a number of SET cells) within a range with two known boundaries (e.g., 64 bits as a lower boundary and 80 bits as a higher boundary out of an encoded user data having a total of 128-bits).

The memory controller 140 may identify a memory cell 105 (e.g., a jth memory cell among SET cells) having a threshold voltage value that is close to a median threshold voltage of a subset of memory cells (e.g., SET cells) storing the encoded user data. The memory controller 140 may apply a read voltage (e.g., through the word lines 110 and the bit lines 115) and increase the read voltage until the jth memory cell turns on (e.g., the jth switching event). When the memory controller 140 detects the jth memory cell turning on (e.g., through the sense component 125), the memory controller 140 may continue to increase the read voltage during a fixed amount of time (e.g., a read reference delay) while detecting additional memory cells 105 turning on. In some embodiments, when the fixed amount of time expires, the memory controller 140 determines that the memory cells 105 that have turned on (e.g., have been activated) are the memory cells 105 having the logic state of 1 (e.g., SET cells). In addition, the memory controller 140 may determine remaining memory cells 105 that did not turn on (e.g., not activated) until the fixed amount of time expired are the memory cells 105 having a logic state of 0 (e.g., RESET cells associated with greater threshold voltages that those of SET cells).

In general, the amplitude, shape, polarity, and/or duration of an applied voltage or current discussed herein may be adjusted or varied and may be different for the various operations discussed in operating the memory device 100. Furthermore, one, multiple, or all memory cells 105 within memory array 102 may be accessed simultaneously; for example, multiple or all cells of memory array 102 may be accessed simultaneously during a reset operation in which all memory cells 105, or a group of memory cells 105, are set to a single logic state.

FIG. 2 illustrates an example of a memory array 202 that supports auto-referenced memory cell read techniques in accordance with embodiments of the present disclosure. Memory array 202 may be an example of portions of memory array 102 described with reference to FIG. 1. As depicted in FIG. 2, memory array 202 includes multiple materials to construct a memory cell 105-a. Each memory cell 105-a is stacked in a vertical direction (e.g., perpendicular to a substrate) to create memory cell stacks (e.g., the memory cell stack 145). The memory cell 105-a may be an example of a memory cell 105 described with reference to FIG. 1. Memory array 202 may thus be referred to as a 3D memory array. The architecture of memory array 202 may be referred to as a cross-point architecture. Although some elements included in FIG. 2 are labeled with a numeric indicator, other corresponding elements are not labeled, though they are the same or would be understood to be similar, in an effort to increase visibility and clarity of the depicted features.

Memory array 202 also includes word lines 110-a and bit lines 115-a, which may be examples of word line 110 and bit line 115 described with reference to FIG. 1. Illustration of the materials between the word lines 110-a and the bit lines 115-a depicted in FIG. 2 may represent a lower portion of the memory cell 105 in FIG. 1. Memory array 202 includes electrodes 205, logic storage elements 210, selector device elements 220, and a substrate 225. In some examples, a single component including a chalcogenide alloy (not shown, replacing selector device element 220, logic storage element 210, and electrode 205-b) may act as both a logic storage element and a selector device. Electrode 205-a may be in electronic communication with bit line 115-a and electrode 205-c may be in electronic communication with word line 110-a.

Insulating materials depicted as empty spaces may be both electrically and thermally insulating. As described above, in PCM technology, various logic states may be stored by varying the electrical resistance of the logic storage element 210 in memory cells 105-a, which in turn exhibiting varying threshold voltages of the memory cells 105-a. In some cases, storing various logic states includes passing a current through the memory cell 105-a, heating the logic storage element 210 in memory cell 105-a, or melting the material of the logic storage element 210 in memory cells 105-a wholly or partially. Other storage mechanism, such as threshold voltage modulation, may be exploited in chalcogenide-based memories.

In some cases, memory array 202 may include an array of memory cell stacks, and each memory cell stack may include multiple memory cells 105-*a*. Memory array 202 may be made by forming a stack of conductive materials, such as word lines 110-*a*, in which each conductive material is separated from an adjacent conductive material by electrically insulating materials in between. The electrically insulating materials may include oxide or nitride materials, such as silicon oxide, silicon nitride, or other electrically insulating materials. These materials may be formed above the substrate 225, such as a silicon wafer, or any other semiconductor or oxide substrate. Subsequently, various process steps may be utilized to form the materials in between the word lines 110-*a* and bit lines 115-*a* such that each memory cell 105-*a* may be coupled with a word line 110-*a* and a bit line 115-*a*.

The selector device element 220 may be connected with the logic storage element 210 through electrode 205-*b*. In some examples, the positioning of the selector device element 220 and the logic storage element 210 may be flipped. The composite stack including the selector device element 220, the electrode 205-*b*, and the logic storage element 210 may be connected to a word line 110-*a* through the electrode 205-*c* and to a bit line 115-*b* through the electrode 205-*a*. The selector device element may aid in selecting a particular memory cell 105-*a* or may help prevent stray currents from flowing through non-selected memory cells 105-*a* adjacent to a selected memory cell 105-*a*. The selector device element 220 may include an electrically non-linear component (e.g., anon-Ohmic component) such as a metal-insulator-metal (MIM) junction, an Ovonic threshold switch (OTS), or a metal-semiconductor-metal (MSM) switch, among other types of two-terminal selector device such as a diode. In some cases, the selector device element includes a chalcogenide alloy. The selector device, in some examples, include an alloy of selenium (Se), arsenic (As), silicon (Si), and germanium (Ge).

As discussed above, memory cells 105-*a* of FIG. 2 may include a material with a variable resistance. Variable resistance materials may refer to various material systems, including, for example, metal oxides, chalcogenides, and the like. Chalcogenide materials are materials or alloys that include at least one of the elements sulfur (S), tellurium (Te), or selenium (Se). Many chalcogenide alloys may be possible—for example, a germanium-antimony-tellurium alloy (Ge—Sb—Te) is a chalcogenide material. Other chalcogenide alloys not expressly recited here may also be employed.

To set a low-resistance state, a memory cell 105-*a* may be heated by passing a current through the memory cell 105-*a*. Heating caused by electrical current flowing through a material that has a finite resistance may be referred to as Joule or Ohmic heating. Joule heating may thus be related to the electrical resistance of the electrodes or the phase change material. Heating the phase change material to an elevated temperature (but below its melting temperature) may result in the phase change material crystallizing and forming the low-resistance state. In some cases, a memory cell 105-*a* may be heated by means other than Joule heating, for example, by using a laser. To set a high-resistance state, the phase change material may be heated above its melting temperature, for example, by Joule heating. The amorphous structure of the molten material may be quenched, or locked in, by abruptly removing the applied current to quickly cool the phase change material.

In some cases, memory cells 105-*a* may exhibit different electrical characteristics after a number of cycling operations (e.g., a series of read or write operations). For example, a threshold voltage of a memory cell 105-*a* (e.g., PCM cell) corresponding to a logic state of 1, after receiving an identical programming pulse to store the logic state of 1 (e.g., a SET programming pulse), may be different if a memory cell 105-*a* is relatively new (e.g., a PCM cell with a small number of read or write operations) compared to a memory cell 105-*a* having been cycled through an extensive number of read or write operations. In addition, in some cases, a chalcogenide material in the memory cells 105-*a* (e.g., the logic storage element 210) may experience a change (which may also be referred to as a drift) in its resistance after programming (e.g., crystallizing or quenching) of the chalcogenide material during a write operation. Such change in resistance may result in changes in threshold voltages of memory cells 105-*a* and may hinder accurately reading information from memory cells 105-*a* (e.g., PCM cells) after a certain period of time elapsed. In some embodiments, the amount of change may be a function of an ambient temperature.

The auto-referenced read may provide a robust read technique when memory cells 105-*a* (e.g., PCM cells) exhibit different electrical characteristics described above. The memory cells 105-*a* may be configured to store encoded user data that include modified user data (or original user data, in some cases) and a number of bits (e.g., flip-bits), which may be added thereto, indicating status of the modification. In some cases, the encoded user data stored in the memory cells 105-*a* have been modified to include a certain number of bits having the logic state of 1. The number of bits having the logic state of 1 may vary within a predetermined range. The auto-referenced read may determine a read reference voltage to apply to the memory cells 105-*a*, namely a voltage that may be used to discern whether a memory cell 105-*a* exhibits a logic state of 1 (e.g., a SET status of a PCM cell) or a logic state of 0 (e.g., a RESET status of a PCM cell). The auto-referenced read may determine the read reference voltage for the memory cells 105-*a* by taking into account of electrical characteristics of the memory cells 105-*a* (e.g., before or after extensive cycling events, before or after a certain time has elapsed). In some embodiments, the reference voltage may be determined based on a number of factors including an estimated median threshold voltage of the memory cells 105 having the logic state of 1 (e.g., SET cells), a standard deviation of threshold voltages of the memory cells 105 having the logic state of 1, a margin factor, among others. The estimated median threshold voltage may be determined based on the predetermined range of the number of memory cells having the logic state of 1. In addition, the margin factor may account for uncertainties in estimating the median threshold voltage.

Figure 3:
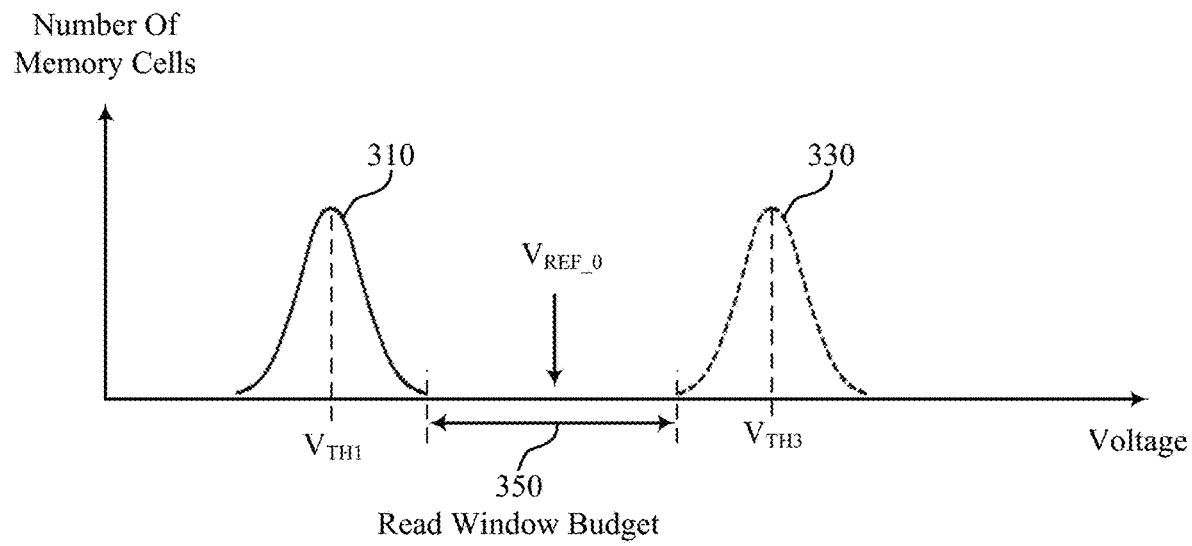
FIG. 3 illustrates examples of threshold voltage distributions that support auto-referenced memory cell read techniques in accordance with embodiments of the present disclosure.
Figure 3:
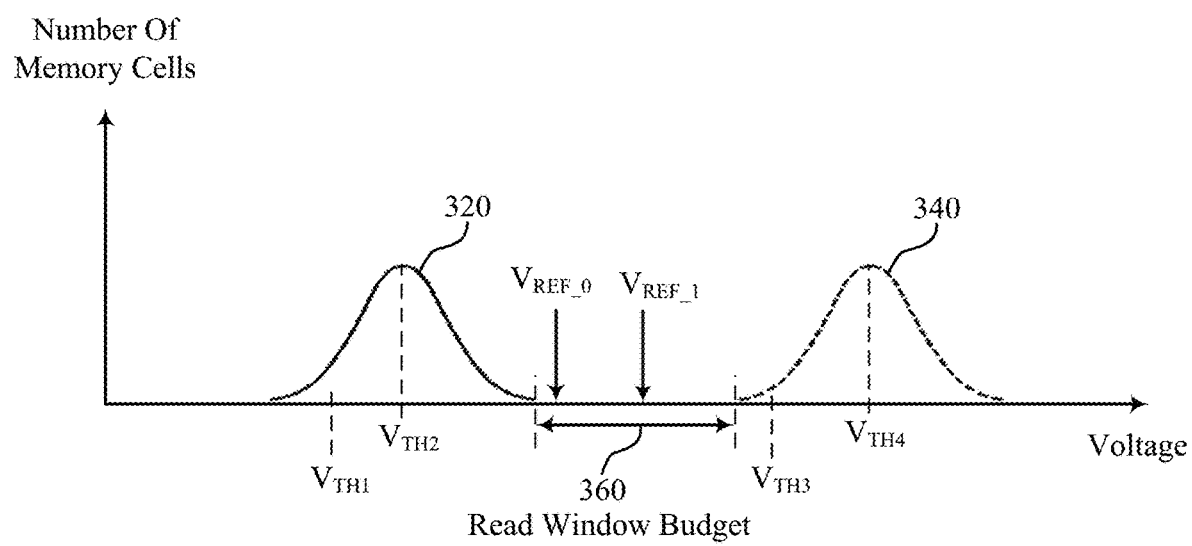

FIG. 3 illustrates examples of threshold voltage ($V_{TH}$) distribution diagrams 301 and 302 of memory cells that supports auto-referenced memory cell read techniques in accordance with embodiments of the present disclosure. Each diagram 301 or 302 represents two groups of threshold voltages corresponding to two logic states (e.g., a logic state of 1, a logic state of 0) of the memory cells. The memory cells (e.g., PCM cells) may be embodiments of the memory cells 105 or 105-*a* described with reference to FIGS. 1 and 2. The logic state of 1 may correspond to a first set of threshold voltages (e.g., a distribution 310, a distribution 320) of the memory cells. In some cases, the logic state of 1 is referred to as a SET state of a PCM cell. The logic state of 0 may correspond to a second set of threshold voltages (e.g., a distribution 330, a distribution 340) of the memory cells. In some cases, the logic state of 0 is referred to as a RESET state of a PCM cell.

$V_{TH}$ distribution diagram 301 depicts a number of memory cells (y-axis) having a certain $V_{TH}$ as a function of threshold voltages (x-axis) of the memory cells. The memory cells of the $V_{TH}$ distribution diagram 301 may represent a set of memory cells storing encoded user data in accordance with the encoding scheme of the present disclosure. In other words, the encoded user data has a number of bits having the logic state of 1 (e.g., SET cells) within a predetermined range. The distribution 310 illustrates a $V_{TH}$ distribution of memory cells having the logic state of 1 (e.g., SET $V_{TH}$ distribution of SET cells). The distribution 330 illustrates a $V_{TH}$ distribution of memory cells having the logic state of 0 (e.g., RESET $V_{TH}$ distribution of RESET cells). The distribution 310 may have a median value denoted as $V_{TH1}$. A standard deviation (e.g., $\sigma_{SET}$) of the distribution 310 determines the width of distribution 310. Similarly, the distribution 330 may have a median value denoted as $V_{TH3}$ and a standard deviation (e.g., $\sigma_{RESET}$) that determines the width of distribution 330.

A difference between the highest threshold voltage of the memory cells having the logic state of 1 (e.g., the SET cells) and the lowest threshold voltage of the memory cells having the logic state of 0 (e.g., the RESET cells) may be referred to as a read window budget 350. A desired read reference voltage may be determined to be at or near the middle of the read window budget 350 as denoted by $V_{REF\_0}$ in FIG. 3. The $V_{TH}$ distributions diagram 301 may illustrate $V_{TH}$ distributions of a set of memory cells (e.g., PCM cells) that are relatively new (e.g., PCM cells with a small number of cycling operations) or recently programmed (e.g., memory cells without a significant drift). In some embodiments, each distribution may not be symmetrical around its median $V_{TH}$ (not shown). In some embodiments, each distribution may exhibit a different ranges of $V_{TH}$ values (not shown).

Similarly, $V_{TH}$ distributions diagram 302 depicts a number of memory cells (y-axis) having a certain $V_{TH}$ as a function of threshold voltages (x-axis) of the memory cells. The $V_{TH}$ distributions diagram 302 may illustrate $V_{TH}$ distributions of the encoded user data (e.g., the encoded user data represented by the $V_{TH}$ distribution diagram 301) stored in a set of memory cells that may have experienced an extensive number of cycling operations representing a different electrical characteristic. The distribution 320 illustrates a $V_{TH}$ distribution of memory cells having the logic state of 1. The distribution 340 illustrates a $V_{TH}$ distribution of memory cells having the logic state of 0. The distribution 320 may have a median value denoted as $V_{TH2}$ that may be greater than $V_{TH1}$. The distribution 340 may have a median value denoted as $V_{TH4}$ that may be greater than $V_{TH3}$. A SET of the distribution 320 may be greater than the $\sigma_{SET}$ of the distribution 310. A $\sigma_{RESET}$ of the distribution 340 may be greater than the $\sigma_{RESET}$ of the $V_{TH}$ distribution 330. As a result, a read window budget 360 of the $V_{TH}$ distributions diagram 302 may be different (e.g., less) than the read window budget 350 of the $V_{TH}$ distributions diagram 301. Therefore, the read reference voltage $V_{REF\_0}$ for the $V_{TH}$ distributions diagram 301 may not be appropriate for the $V_{TH}$ distributions diagram 302. A new desired read reference voltage $V_{REF\_1}$ may be configured to support accurate reading of the memory cells of the $V_{TH}$ distributions diagram 302. The change in the read window budget and the associated change in the read reference voltage may be a result of memory cells experiencing extensive cycling operations and/or significant drift events.

The auto-referenced read may provide a robust read technique for both situations, e.g., the memory cells depicted in the $V_{TH}$ distributions diagram 301 or 302. In some embodiments, the auto-referenced read identifies a memory cell having a $V_{TH}$ value close to the median $V_{TH}$ value (e.g., $V_{TH1}$ of $V_{TH}$ distribution 310, $V_{TH2}$ of $V_{TH}$ distribution 320). The auto-referenced read may determine such memory cell (e.g., a memory cell having a jth threshold voltage value in ascending order) based on a knowledge that encoded user data has a number of bits having the logic state of 1 (e.g., SET cells) within a predetermined range. The auto-referenced read may apply a read voltage (e.g., an activation voltage) to the memory cells in order to detect the memory cell turning on (e.g., the memory cell exhibiting a jth switching event) while the read voltage amplitude increases with respect to time. The read voltage may provide a bijective correspondence between a read voltage value and time.

After detecting the jth switching event, the auto-referenced read may continue to increase the read voltage for a predetermined duration to detect additional memory cells having the logic state of 1 switching. The predetermined duration of time may be determined by $\sigma_{SET}$ (e.g., $\sigma_{SET}$ of the $V_{TH}$ distribution 310, $\sigma_{SET}$ of the $V_{TH}$ distribution 320), among other factors, taking into account the spread in the $V_{TH}$ distributions (e.g., the $V_{TH}$ distribution 310, the $V_{TH}$ distribution 320). A read voltage value corresponding to the read voltage at the completion of the predetermined duration may be referred to as a desired read reference voltage (e.g., $V_{REF\_0}$, $V_{REF\_1}$). In other words, the auto-referenced read may appropriately position a read reference voltage (e.g., $V_{REF\_0}$, $V_{REF\_1}$) as a function of a median $V_{TH}$ (e.g., $V_{TH1}$, $V_{TH2}$) and $\sigma_{SET}$ of a given $V_{TH}$ distribution of memory cells having the logic state of 1 (e.g., the $V_{TH}$ distribution 310, the $V_{TH}$ distribution 320) to accurately read information from the memory cells storing the encoded user data.

Figure 4A:
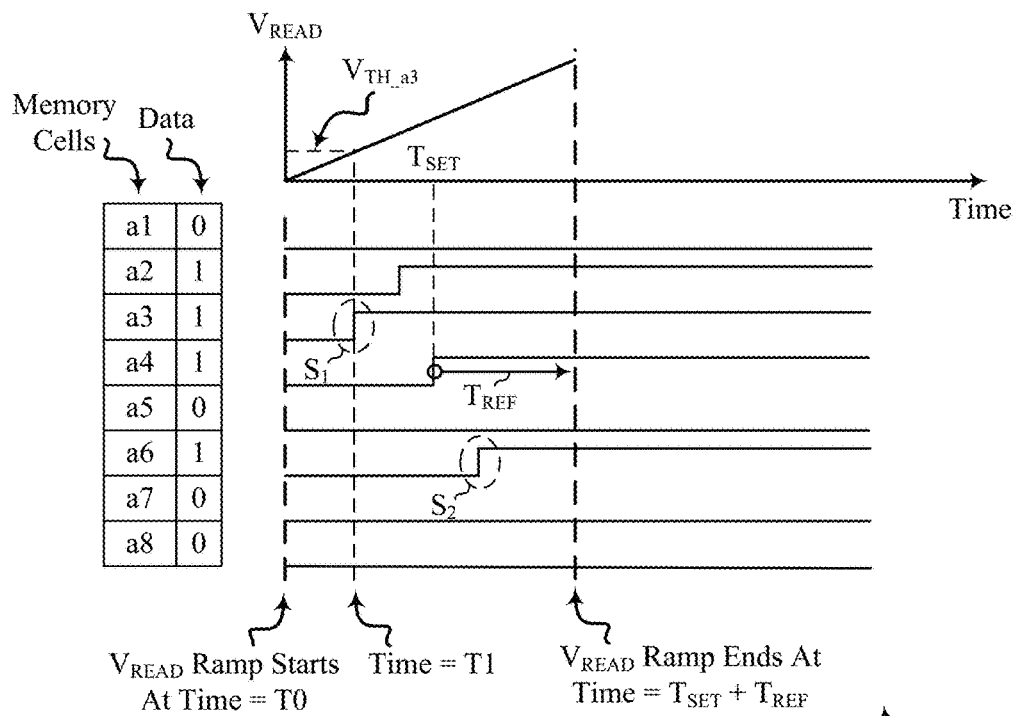
FIGS. 4A and 4B illustrate techniques that support auto-referenced memory cell read techniques in accordance with embodiments of the present disclosure.

FIG. 4A illustrates an exemplary diagram 401 that supports auto-referenced memory cell read techniques in accordance with various embodiments of the present disclosure. The diagram 401 illustrates a read voltage (e.g., $V_{READ}$) applied to memory cells (e.g., memory cells 105 described with reference to FIGS. 1 and 2). The read voltage may be applied to the memory cell through a bit line (e.g., bit lines 115 described with reference to FIGS. 1 and 2) and a word line (e.g., word lines 110 described with reference to FIGS. 1 and 2). The read voltage may provide a bijective correspondence between a read voltage value and time. In some embodiments, the read voltage has a constant ramp rate as depicted in FIG. 3 (e.g., 20 mV/ns).

The diagram 401 also illustrates a user data pattern (e.g., 01110100 corresponding to memory cells a1 through a8). The user data pattern may have been encoded to implement a number of memory cells having the logic state of 1 to be within a predetermined range. By way of example, the user data pattern in the diagram 401 has four memory cells with the logic state of 1 (e.g., SET bits). In some cases, the number of memory cells having the logic state of 1 may be expressed as a weight (e.g., a weight of 50% when four out of eight memory cells have the logic state of 1). The diagram 401 illustrates four memory cells (e.g., a2, a3, a4, and a6) having the logic state of 1. The memory cells a2, a3, a4, and a6 may have four different $V_{TH}$ values while all four $V_{TH}$ values represent the logic state of 1. By way of example, the diagram 401 shows that $V_{TH}$ value of memory cell a3 is the lowest of the four while the $V_{TH}$ value of memory cell a6 is the highest. The auto-referenced read may determine the third $V_{TH}$ value (e.g., the Vim value associated with the memory cell a4) to be close to the median $V_{TH}$ value of the four different $V_{TH}$ values.

The auto-referenced read may initiate ramping of a read voltage, $V_{READ}$ at time T0. The diagram 401 also shows horizontal lines associated with each memory cell. Some of the horizontal line have a step while others do not. The step in the horizontal line represents a switching event (e.g., a memory cell turning on, being activated, or switching on) when the applied $V_{READ}$ across the memory cell is greater than a $V_{TH}$ of the memory cell. Hence, the horizontal lines may represent a response by the memory cells (e.g., a presence of a current flowing through a memory cell or lack thereof) while $V_{READ}$ increases. By way of example, the memory cell a3 may turn on (e.g., switching event $S_1$ denoted in FIG. 4A) at time T1 and may be the first memory cell turning on among the four memory cells having the logic state of 1. At time T1, $V_{READ}$ exceeds the threshold voltage of the memory cell a3, denoted as $V_{TH\_a3}$ in FIG. 4A, and activates the memory cell a3 as depicted by the switching event $S_1$.

Subsequently, the auto-reference read may detect the third switching event when memory cell a4 (e.g., the memory cell with a $V_{TH}$ value close to a median $V_{TH}$ value) switches on and then identifies a predetermined time duration (e.g., $T_{REF}$). The auto-reference read may continue to increase $V_{READ}$ until the predetermined time duration expires. An additional memory cell a6 may switch during $T_{REF}$ time period as indicated by the switching event $S_2$ depicted in the diagram 401. In some embodiments, when the predetermined time duration elapses (e.g., at time $T_{SET}+T_{REF}$), the auto-referenced read stops applying $V_{READ}$ to the memory cells and determine that all the memory cells that have been activated (e.g., turned on) are the memory cells having the logic state of 1, namely a2, a3, a4, and a6. The other memory cells, namely a1, a5, a7, and a8, do not turn on (e.g., no switching event detected) until the time $T_{SET}+T_{REF}$ expires and the auto-reference read may determine that the memory cells a1, a5, a7, and a8 represent the logic state of 0.

Figure 4B:
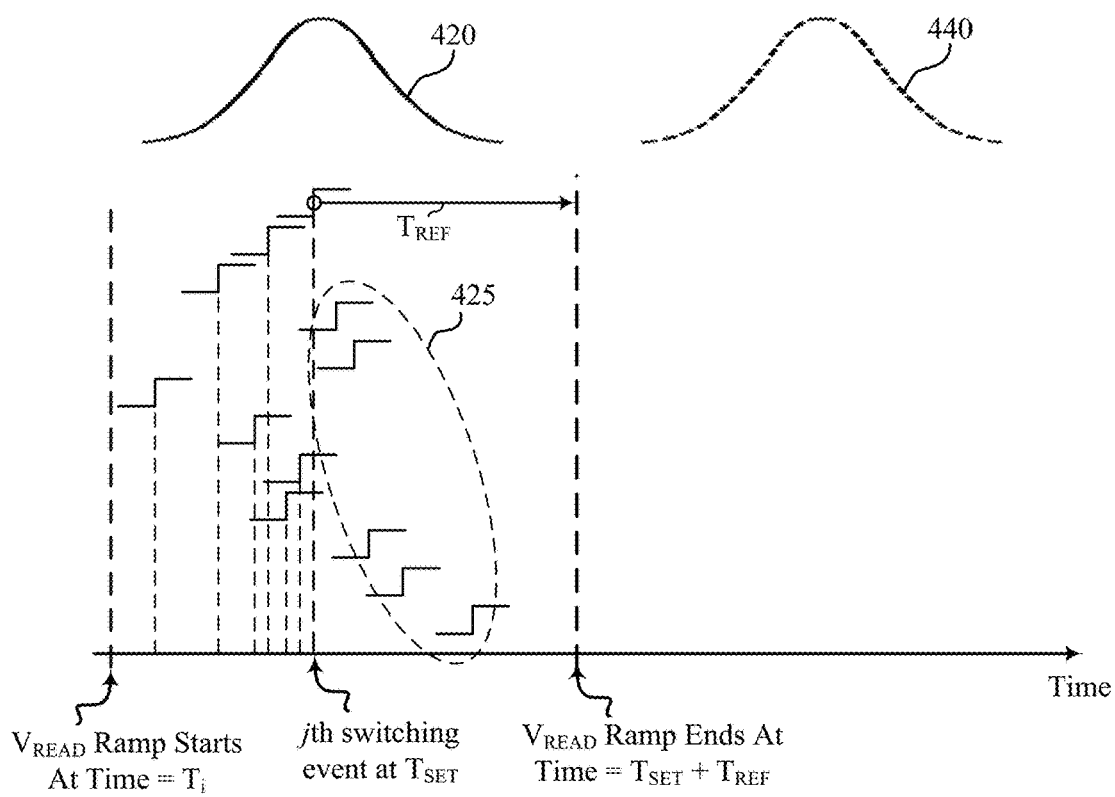

FIG. 4B illustrates an exemplary diagram 402 that supports auto-referenced memory cell read techniques in accordance with various embodiments of the present disclosure. The diagram 402 illustrates a generalized case of the exemplary diagram 401 for the auto-reference read. The diagram 402 includes a distribution of $V_{TH}$ of memory cells having the logic state of 1 (e.g., a distribution 420) out of memory cells storing an encoded user data. The diagram 402 also includes a distribution of $V_{TH}$ of memory cells having the logic state of 0 (e.g., distribution 440) out of memory cells storing the encoded user data. The distribution 420 may be an example of the distribution 310 or 320 described with reference to FIG. 3. The distribution 440 may be an example of the distribution 330 or 340 described with reference to FIG. 3. The diagram 402 also illustrates a number of switching events associated with the memory cells having the logic state of 1, that may occur while $V_{READ}$ voltage starts to increase at time $T_i$. In some embodiments, the $V_{READ}$ voltage at time $T_i$ is less than a lowest $V_{TH}$ of the distribution 420 so that the first switching event may correspond to a memory cell with the lowest $V_{TH}$ turning on as shown in the diagram 402. In other embodiments, the $V_{READ}$ voltage at time $T_i$ is greater than the lowest $V_{TH}$ value but less than a median $V_{TH}$ value. Then, at time $T_i$, a number of memory cells may turn on at $T_i$ such that a total read time may be reduced.

The auto-referenced read may identify a jth switching event that correlates to a median $V_{TH}$ of the distribution 420. The jth switching event may or may not correspond to a true median $V_{TH}$ of the distribution 420. In some embodiments, such identification of the jth switching event may be based at least in part on the encoding of a user data pattern. The encoding may ensure that the encoded user data pattern to have its weight (e.g., a number of memory cells having the logic state of 1 out of the entire user data pattern) within a predetermined range (e.g., [50%, (50+50/k) %]) associated a design factor (e.g., k value). A greater k value provides a narrower predetermined range, which in turn supports a more accurate determination of the jth switching event.

In some embodiments, when the auto-referenced read detects the jth switching event at time $T_{SET}$, the auto-referenced read identifies a fixed time duration $T_{REF}$. Such determination may be based at least in part on a standard deviation of the distribution 420, an uncertainty factor associated with identifying the jth switching event at time $T_{SET}$, a margin to ensure capturing additional memory cells having the logic state of 1 within an acceptable error, among others. During the fixed time duration $T_{REF}$ the auto-referenced read may continue to increase $V_{READ}$ while additional memory cells having the logic state of 1 may switch (e.g., the additional memory cells experiencing switching events depicted with a group 425). In some embodiments, when the time reaches $T_{SET}+T_{REF}$, the auto-referenced read stops applying the $V_{READ}$. The auto-referenced read may then determine that the memory cells which have been activated (e.g., turned on, switched on) by the time $T_{SET}+T_{REF}$ are the memory cells having the logic state of 1 (e.g., memory cells of the distribution 420). In addition, the auto-referenced read may determine that the memory cells which did not turn on by the time $T_{SET}+T_{REF}$ are the memory cells having the logic state of 0 (e.g., memory cells of the distribution 440).

Figure 5A:
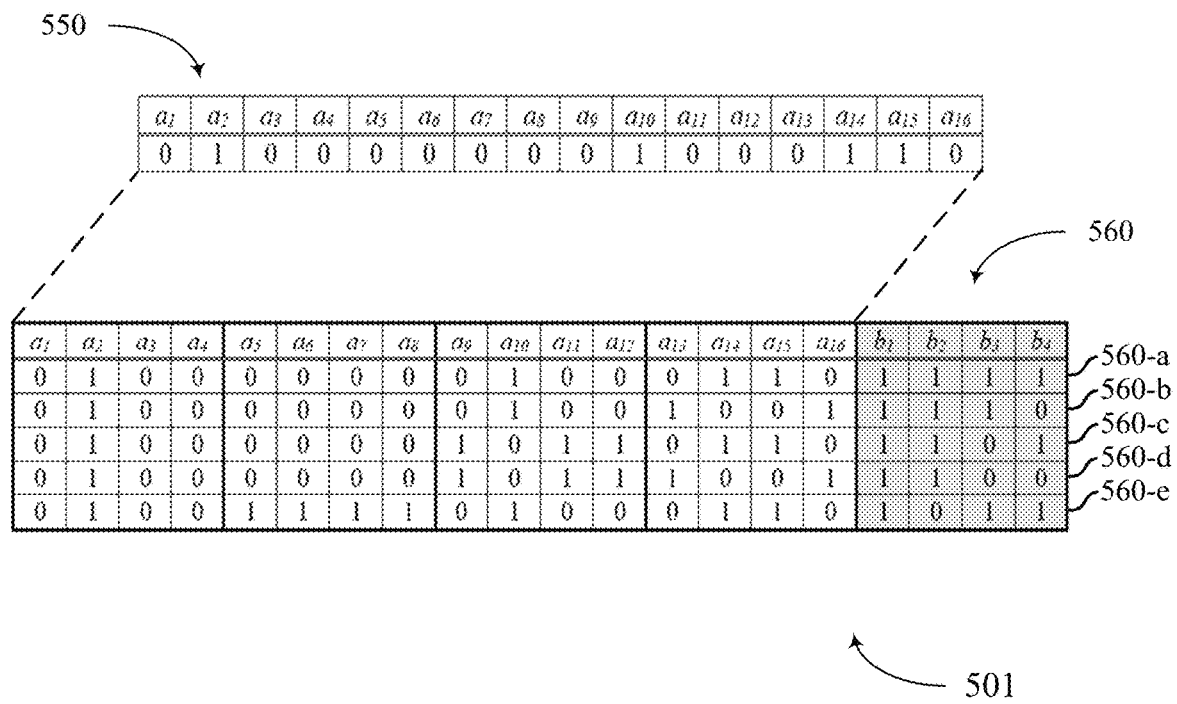
FIGS. 5A and 5B illustrate examples of user data patterns and a circuit diagram that support auto-referenced memory cell read techniques in accordance with embodiments of the present disclosure.

FIG. 5A illustrates exemplary user data pattern 501 that supports auto-referenced memory cell read techniques in accordance with embodiments of the present disclosure. The user data pattern 501 illustrates an original form of user data 550 and encoded form of the user data 560. The user data 550 may be referred to as an input vector in some cases. The encoded user data 560 may include additional bits (e.g., $b_1$ through $b_4$). The additional bits may be referred to as flip-bits and indicate a status of the user data as described below. The auto-referenced read may include an encoding technique for generating an encoded user data having a weight (e.g., a number of bits having the logic state of 1 out of a total number of bits in the user data) within a predetermined interval. In some embodiments, the interval is 50% through $$\left(50+\frac{50}{k}\right)\%$$

where K is u predetermined factor. In some cases, the interval is expressed as $$\left[50\%,\left(50+\frac{50}{k}\right)\%\right].$$

For example, when k is equal to 4, the interval is 50% to 62.5% (e.g., [50%, 62.5%]). A different weight other than 50% as a lower bound of the interval may be feasible. Illustrations in FIG. 5A refer to 50% as a lower bound of the interval for a concise description of the depicted features; however, as a person of ordinary skill in the art would appreciate that other alternatives and different variations may be contemplated and fall within the scope of this disclosure.

By way of example, the user data 550 have 16 bits (e.g., $a_1$ through $a_{16}$) as depicted in FIG. 5A. In a case in which k is equal to 4, the predetermined interval for the encoded user data to meet is [50%, 62.5%]. Various forms of the encoded user data 560, when k=4, are illustrated in FIG. 5A. The encoding technique may add k number of flip-bits (e.g., $b_1$ through $b_4$ when k=4) to the user data 550 (e.g., $a_1$ through $a_{16}$) to generate the encoded user data 560. In addition, the original user data pattern may be partitioned into k number of portions (e.g., four portions or segments when k=4). For example, a first portion may include bits $a_1$ through $a_4$. The first portion may be associated with a first flip bit, $b_1$. A second portion may include bits $a_5$ through $a_8$. The second portion may be associated with the second flip bit, $b_2$. A third portion may include bits $a_9$ through $a_{12}$. The third portion may be associated with the third flip bit, $b_3$. A fourth portion may include bits $a_{13}$ through $a_{16}$. The fourth portion may be associated with the fourth flip bit, $b_4$. In some embodiments, initial values of $b_1$ through $b_4$ correspond to the logic state of 1 (e.g., 1111 of the encoded user data pattern 560-a). The logic state of 1 in the flip-bits may indicate that corresponding portions of the original user data are not inverted. Conversely, the logic state of 0 in the flip-bits may indicate that corresponding portions of the original user data are inverted.

As described above, the auto-referenced read may determine a weight of the encoded user data pattern 560 as a percentage. For example, the encoded user data 560-a has a weight of 25% (e.g., 4 bits having the logic state of 1 out of 16 bits in the user data), which does not meet the predetermined interval of [50%, 62.5%] when k=4. Further, the encoding technique may vary the logic states of the flip-bits throughout all possible combinations of logic states of the flip-bits to find a particular encoded user data that has a particular weight within the predetermined interval (e.g., an interval of [50%, 62.5%] when k=4). When there are k flip-bits (e.g., k=4), there are a total of $2^k$ (e.g., $2^4$=16) combinations, such as 1111, 1110, 1101, 1100, . . . , 0001, and 0000.

When a logic state of a flip-bit corresponds to the logic state of 0, the auto-referenced read may invert the logic states of the corresponding portion of the user data and evaluate a weight. By way of example, when the flip-bits are 1110 as shown in the encoded user data 560-b, the logic states of the fourth portion (e.g., bits $a_{13}$ through $a_{16}$) are inverted to 1001 from 0110. Then, the encoding technique may determine that the encoded user data pattern 560-b has a weight of 25% (e.g., 4 bits having the logic state of 1 out of 16 bits in the user data), which does not meet the predetermined condition of the weight within the interval of [50%, 62.5%]. The encoding technique may restore the logic states of the fourth portion back to 0110 and vary the content of the flip-bits to a next combination (e.g., 1101 as shown in the encoded user data 560-c). The encoding technique may invert the logic states of the third portion (e.g., bits $a_9$ through $a_{12}$) to 1011 from 0100 as shown in the encoded user data 560-c and determine that the encoded user data pattern 560-c has a weight of 38% (e.g., 6 bits having the logic state of 1 out of 16 bits in the user data), which does not meet the predetermined condition of the weight within the interval of [50%, 62.5%], either.

The auto-referenced read may continue varying the content of the flip-bits, inverting logical values of the bits of corresponding portions of the user data according to the flip-bits, and thereby evaluating weights of the encoded user data until an encoded user data meets the predetermined condition (e.g., the interval of [50%, 62.5%]). For example, the encoded user data 560-d has weights of 38% and does not meet the predetermined condition of [50%, 62.5%] weight interval. The encoded user data pattern 560-e has the flip-bit contents of 1011 and the second portion of the user data (e.g., bits $a_5$ through $a_8$) are inverted to 1111 from 0000. The weight of the encoded user data 560-e is 50% (e.g., 8 bits having the logic state of 1 out of 16 bits in the user data), which meets the predetermined condition of having the weight between [50%, 62.5%]. The coding technique may stop varying the content of the flip-bits based on determining that the encoded user data pattern 560-e meets the predetermined condition and the coded user data pattern 560-e may be stored in memory cells. The flip-bit contents (e.g., 1011) may be used to accurately decode the encoded user data when reading the encoded user data from the memory cells. For example, the logic states of bits $a_5$ through $a_8$ (e.g., 1111) of the encoded user data 560-e may be inverted back to their original logic states (e.g., 0000) based on the value of the flip-bit, $b_2$ (e.g., the logic state of 0 of $b_2$ indicating the bits $a_5$ through $a_8$ having been inverted) when reading the encoded user data 560-e.

Figure 5B:
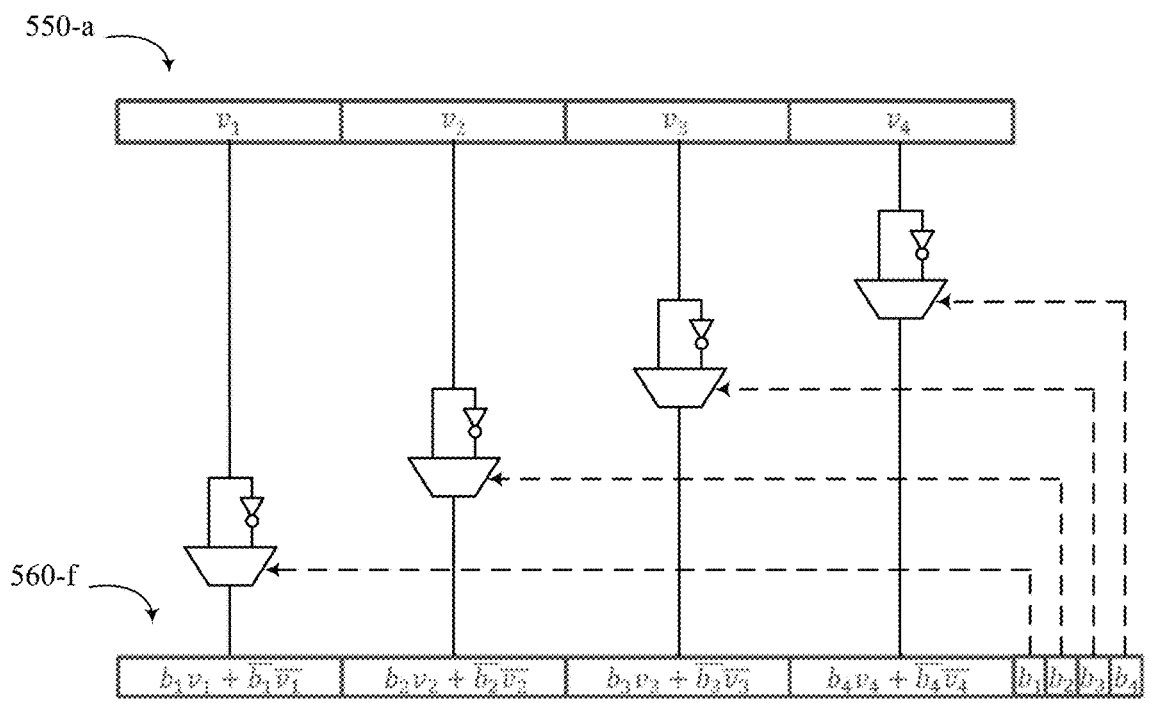

FIG. 5B illustrates an exemplary diagram 502 that supports auto-referenced memory cell read techniques in accordance with embodiments of the present disclosure. The diagram 502 may represent a circuit diagram implementing the encoding technique described with reference to FIG. 5A. The diagram 502 illustrates an user input 550-a. The user input 550-a may be a generalized form of the user data 550 described with reference to FIG. 5A. The user input 550-a may be referred to as an input vector. In some cases, the user input 550-a may have a total of $2^n$ bits. The user input 550-a depicted in FIG. 5B may be an example of an input vector when k=4 and have four segments (e.g., segments $v_1$ through $v_4$). Each segment (e.g., the segment $v_1$) may have $$\frac{2^n}{k}$$

bits. The diagram 502, also illustrates an encoded user input 560-f. The encoded user input 560-f may be a generalized form of the encoded user input 560-e in which k is equal to 4. The encoded user input 560-f may include k number of bits added to the user input 550-a (e.g., bits $b_1$ through $b_4$ when k=4). In addition, the diagram 502 shows that each of the added bits (e.g., bits $b_1$ through $b_4$) indicates the status of bits in each segments associated with the added bit (e.g., the logic state of $b_1$ indicating the status of the bits in the segment $v_1$) expressed as $b_1 v_1 + \overline{b_1 v_1}$.

The diagram 502 represents an encoding scheme of inverting the user data when a flip-bit content is the logic state of 0 as described with reference to FIG. 5A. The coding technique may not lose its functionality for the case of inverting the user data when a flip-bit content is the logic state of 1. In addition, a person of ordinary skill in the art would appreciate that there exists an encoded user data pattern that has its weight within a predetermined weight interval of $$\left[50\%, \left(50 + \frac{50}{k}\right)\%\right]$$

for a given k value. In other words, for any pattern of 1's and 0's in an input vector v, a combination of flip-bits (e.g., $b_1$ through $b_k$) may exist, which may operate on k segments $v_1, \ldots, v_k$ of the input vector v such that a weight of a pattern of 1's and 0's of a resulting encoded input vector (e.g., after applying the inversions in accordance with the combination of k flip-bits), is in the range of $$\left[50\%, \left(50 + \frac{50}{k}\right)\%\right].$$

Figure 6:
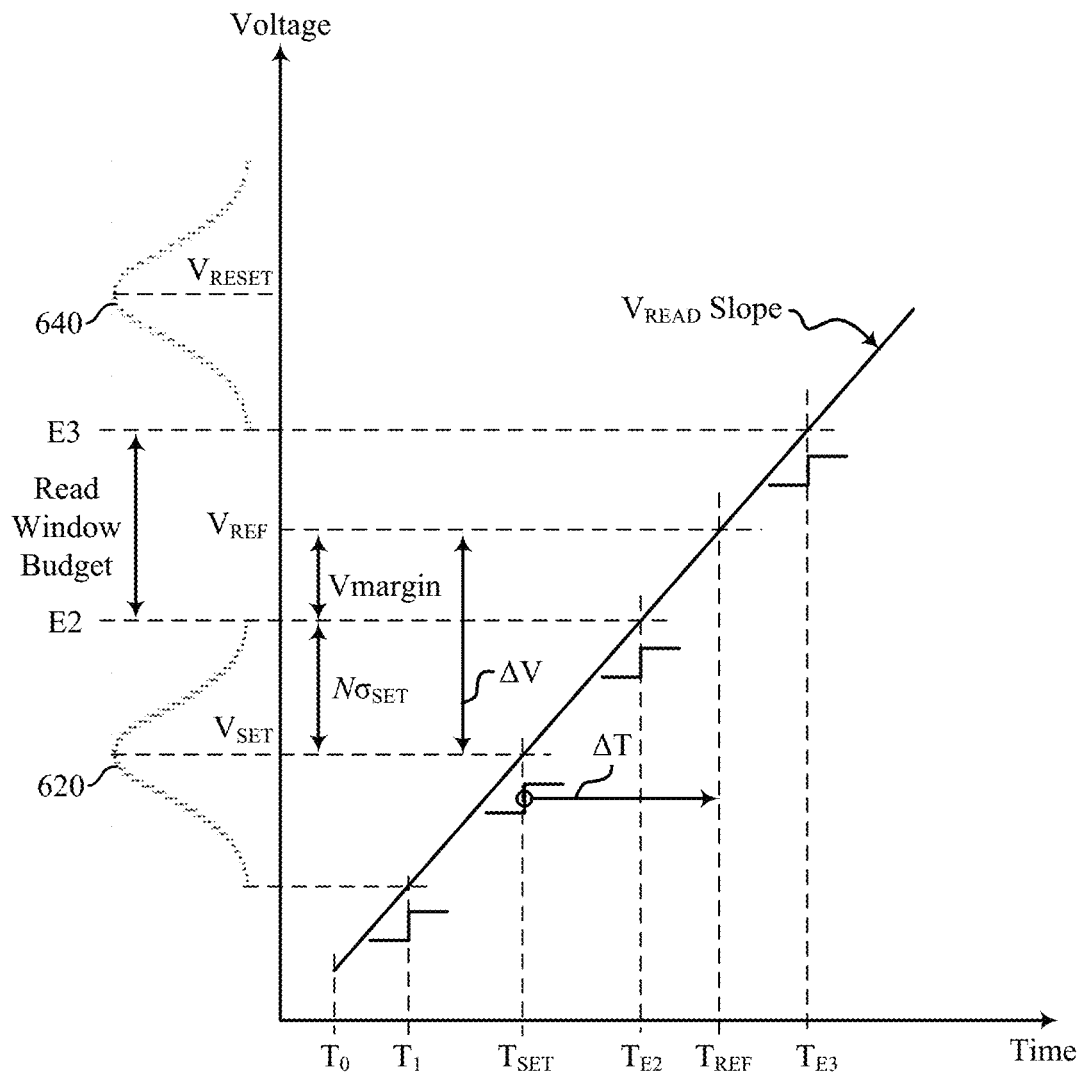
FIG. 6 illustrates an auto-referenced memory cell read technique in accordance with embodiments of the present disclosure.

FIG. 6 illustrates an exemplary diagram 600 that supports auto-referenced memory cell read techniques in accordance with embodiments of the present disclosure. The auto-referenced read may obtain a reliable read reference for encoded user data having the weight within a predetermined interval $$\left(\text{e.g., } 50\% \text{ to } \left(50 + \frac{50}{k}\right)\%\right).$$

The example 600 depicts a voltage (e.g., y-axis) applied to memory cells storing encoded user data as a function of time (e.g., x-axis). The voltage may be referred to as an activation voltage or a read voltage (e.g., $V_{READ}$). In some embodiments, the read voltage may be applied using the bit line 115 and the word line 110 described with reference to FIGS. 1 and 2. In some embodiments, the voltage may increase at a constant rate of increase, thus having a constant slope (e.g., 20 mV increase per nanosecond, 20 mV/nsec) with respect to time. In addition, two distributions of threshold voltages are juxtaposed to represent a distribution 620 of threshold voltages associated with memory cells having the logic state of 1 (e.g., SET cells) and a distribution 640 of threshold voltages associated with memory cells having the logic state of 0 (e.g., RESET cells) of the encoded user data. The distributions 620 and 640 may be examples of the distributions 420 and 440 described with reference to FIGS. 4A and 4B.

The distribution 620 may have a median value (e.g., $V_{SET}$) of the threshold voltages as depicted in FIG. 6. In some cases, $V_{SET}$ may represent a true median threshold voltage value of the distribution 620. In other cases, $V_{SET}$ may represent an estimation of a median threshold voltage value ($\hat{V}_{SET}$) of the distribution 620. The distribution 620 may have a standard deviation (e.g., $\sigma_{SET}$). The distribution 640 may have a median value (e.g., $V_{RESET}$) of the threshold voltages. A highest threshold voltage of the distribution 620 may be denoted as E2 as shown in FIG. 6. A lowest threshold voltage of the distribution 640 may be denoted as E3 as shown in FIG. 6. A difference between E3 and E2 may represent a read window budget as shown in FIG. 6. The read window budget shown in FIG. 6 may be an example of the read window budgets 350 or 360 described with reference to FIG. 3. A read reference voltage (e.g., $V_{REF}$) may be positioned within the read window budget (e.g., at or near the middle of the read window budget) to differentiate between memory cells having the logic state of 1 (e.g., the distribution 620) and memory cells having the logic state of 0 (e.g., the distribution 640). The $V_{REF}$ shown in FIG. 6 may be an example of $V_{REF\_0}$ or $V_{REF\_1}$ described with reference to FIG. 3. The $V_{REF}$ may correspond to a time (e.g., $T_{REF}$) based on a bijective nature of the voltage with respect to time as depicted in FIG. 6.

The distribution 620, in some embodiments, may be a Gaussian distribution with a standard deviation (e.g., $\sigma_{SET}$=100 mV). In some embodiments, a half-width of the distribution 620 (e.g., E2–$V_{SET}$) under a desired raw bit error rate (RBER) may be determined in terms of $\sigma_{SET}$. For example, an RBER of $2\times10^{-4}$ may produces 3.54 times a SET for a half-width of the distribution 620. In other words, a value of N in expression $N\times\sigma_{SET}$ may be 3.54 and (E2–$V_{SET}$) is equal to 354 mV in light of $\sigma_{SET}$ being 100 mV in this example. It should be appreciated that the half-width of the distribution 620 depends on the standard deviation of the distribution 620.

In addition, a margin voltage (e.g., Vmargin depicted in FIG. 6) may be determined to support the $V_{REF}$ located away from the edge of distribution 620 (e.g., E2) under a given RBER requirement. The half-width of distribution 620 (e.g., E2–$V_{SET}$, $N\sigma_{SET}$) and the margin voltage (e.g., Vmargin) may represent a voltage difference between $V_{SET}$ and $V_{REF}$ (e.g., $\Delta V$). The voltage difference (e.g., $\Delta V$) may be translated to a time difference (e.g., $\Delta T$) using a constant slope in the read voltage (e.g., 20 mV/nsec). For example, when a $\Delta V$ is determined to be 500 mV, then a corresponding $\Delta T$ is 25 nsec in light of the constant slope of 20 mV/nsec. Hence, the auto-referenced read may determine and apply an additional time delay (e.g., $\Delta T$) when the applied read voltage triggers a memory cell corresponding to a median threshold voltage (e.g., $Y_{SET}$) to switch (e.g., the jth switching event described with reference to FIG. 4B) to detect additional memory cells switching (e.g., the memory cells represented by the group 425 described with reference to FIG. 4B) in order to determine memory cells having the logic state of 1 within a particular RBER limit (e.g., RBER of $2\times10^{-4}$).

Ascertaining a true median value (e.g., $V_{SET}$) of a distribution (e.g., the distribution 620) may not be practical in some embodiments. The auto-referenced read may determine an estimated median threshold voltage ($\hat{V}_{SET}$) of the distribution 620 by utilizing properties of order statistics. In some embodiments, the auto-referenced read determines a jth smallest value (e.g., the jth switching event described with reference to FIG. 4B) close to the true median value. In addition, the auto-referenced read may utilize the fact that encoded user data have a weight within two known boundaries $$\left(\text{e.g., } 50\% \text{ and } \left(50 + \frac{50}{k}\right)\%\right).$$

The two known boundaries (e.g., two known numbers of bits having the logic state of 1 in encoded user data) may facilitate to minimize an error in determining $\hat{V}_{SET}$ and the jth smallest value as described below.

An order statistics may be associated with $X_1, X_2, \ldots,$ and $X_n$ as random samples extracted from a distribution function $f(x)$. $X_1, X_2, \ldots,$ and $X_n$ may be arranged in ascending order $Y_1, Y_2, \ldots,$ and $Y_n$ in which $Y_1 \leq Y_2 \ldots \leq Y_n$. In other words, $Y_1, Y_2, \ldots,$ and $Y_n$ may represent an ordered sequence of $X_1, X_2, \ldots,$ and $X_n$ based on magnitude of each X value. $Y_j$ may be referred to as the jth order statistics of $X_1, X_2, \ldots,$ and $X_n$. In particular, $Y_1$ is the minimum of $X_1, X_2, \ldots,$ and $X_n$ while $Y_n$ is the maximum of $X_1, X_2, \ldots,$ and $X_n$. In addition, when n is an odd number, $Y_j$ with $$j = \frac{(n-1)}{2} + 1$$

corresponds to an estimated median of the distribution function $f(x)$. When n is an even number, an estimated median of the distribution function $f(x)$ may be $$\frac{1}{2}(Y_j + Y_{j+1})$$

with $$j = \frac{n}{2}.$$

A probability density function of the jth order statistics (e.g., $Y_j$) may be expressed as $$f_{Yj}(y) = \frac{n!}{(j-1)!(n-j)!} F(y)^{j-1}[1 - F(y)]^{n-j} f(y)$$

where F(y) is a cumulative distribution function and f(y) a probability density function of a variable y in the ordered set (e.g., $Y_1, Y_2, \ldots,$ and $Y_n$ being particular values of y).

As illustrated in an example below, the auto-referenced read may utilize properties of order statistics to calculate an estimated median threshold voltage value ($\hat{V}_{SET}$) of a distribution 620. An acceptable RBER of $2\times10^{-4}$ may be used for illustration purposes. Encoded user data may have a total of 128 bits. The k value used for encoding the user data may be 4. Thus, an encoding of the user data may have been carried out to generate a weight of the encoded user data in the interval of $$\left[50\%, \left(50 + \frac{50}{K}\right)\%\right],$$

namely [50%, 62.5%]. In other words, the number of memory bits having the logic state of 1 in the encoded user data of 128 bits may be between 64 (e.g., 50% of 128 bits, n=64) through 80 (e.g., 62.5% of 128 bits, n=80). Expressed differently, the encoded user data may include a number of bits having the logic state of 1 in the interval of [64, 80].

A particular j value, namely $j_{opt}$, may be determined to minimize an uncertainty $U_j$ (e.g., an uncertainty associated with identifying a jth smallest value as a median value), which may be heuristically expressed as $U_j = 3.54 (\sigma_{64} + \sigma_{80}) + (\mu_{64} - \mu_{80})$ for a given j value. In other words, for a given j value, standard deviations (e.g., $\sigma_{64}, \sigma_{80}$) and means (e.g., $\mu_{64}, \mu_{80}$) may be estimated using the probability density function associated with the given j value for two known cases of n=64 and n=80. Then, a particular j value, namely $j_{opt}$ may be determined by listing all the possible $U_j$ values as a function of various j values and selecting the particular j value (e.g., j=26) that minimizes the uncertainty $U_j$. Then, the probability density distributions of $Y_{26}$ when n=64 and $Y_{26}$ when n=80 (e.g., the probability density functions of the 26th order statistics for two known extreme cases of the number of SET cells, 64 and 80) may be used for further calculations. Namely, $\sigma_{64}$ and $\mu_{64}$ represent a standard deviation and a mean of the probability density function of the 26th order statistics when n=64 (e.g., $Y_{26}$ with n=64). Similarly, $\sigma_{80}$ and $\mu_{80}$ represent a standard deviation and a mean of the probability density function of the 26th order statistics when n=0.80 (e.g., $Y_{26}$ with n=80). Further, $\mu_{64}$ and $\mu_{80}$ may produce an estimation of $\hat{V}_{SET}$ by using an expression $(\mu_{64} + \mu_{80})/2 + \Delta$, where $\Delta$ is the correction applied to not have a polarized estimator.

In this example, $j_{opt}$ is determined to be 26 that produces a minimum uncertainty $U_j$ of 128.7 mV. In other words, the 26th smallest threshold voltage value of the SET distribution may be considered to be the closest threshold voltage value to an estimated median threshold voltage value ($\hat{V}_{SET}$) associated with the minimum uncertainty of 128.7 mV. As noted above, RBER is equal to $2\times10^{-4}$ and a standard deviation, $\sigma_{SET}$, is equal to 100 mV in this example. Also, the values of $\sigma_{64}$ and $\mu_{64}$ may correspond to 15.79 mV and 4,610.3 mV. In addition, $\sigma_{80}$ and $\mu_{80}$ may correspond to 14.55 mV and 4,589 mV. The estimated value of $V_{SET}$ may be 4,562.7 mV with $\Delta$ of −37 mV, which may imply that the jth smallest threshold voltage may be less than $\hat{V}_{SET}$ by 37 mV.

Based on the procedure and calculations outlined above, the auto-referenced read may be further described using the exemplary diagram 600 depicted in FIG. 6. The auto-referenced read may apply a read voltage at time $T_0$ to memory cells that store encoded user data having the weight within a predetermined interval $$\left(\text{e.g., } 50\% \text{ to } \left(50 + \frac{50}{k}\right)\%\right).$$

Initial value of the read voltage (e.g., the voltage applied to memory cells at $T_0$) may be small enough not turn on any of the memory cells having the logic state of 1 (e.g., SET cells). In some embodiments, the initial value of the read voltage may be greater than the lowest $V_{TH}$ value of the distribution 620 but less than $V_{SET}$ of the distribution 620 to reduce an overall time for reading memory cells of the distribution 620. In some embodiments, the read voltage may increase with a constant rate of increase with respect to time (e.g., 20 mV/nsec). In other embodiments, the read voltage has a monotonically increasing staircase shape. At time=$T_1$, the read voltage may become large enough to cause a memory cell having the lowest threshold voltage (e.g., a SET cell with a minimum threshold voltage) to switches. As a person of ordinary skill in the art would appreciate, increasing the read voltage may be equivalent to generating an ordered sequence of $V_{TH}$ values (e.g., $Y_1, Y_2, \ldots,$ and $Y_n$ in which $Y_1 \leq Y_2 \ldots \leq Y_n$) out of the distribution 620. The auto-referenced read may continue to increase the read voltage while tracking a number of memory cells (e.g., SET cells) turning on.

The auto-referenced read may detect a particular switching event at a predetermined order (e.g., the 26th switching event that corresponds to $j_{opt}$ event described above) at time $T_{SET}$. In other words, at time $T_{SET}$, a memory cell having the 26th smallest threshold voltage value (e.g., the jth switching event) may turn on. Hence, the auto-referenced read may determine that the read voltage is near the estimated value of $V_{SET}$ at time $T_{SET}$. The auto-referenced read may determine a voltage difference (e.g., $\Delta V$) by using the following expression, $$\Delta + 3.54 \times \sigma_{SET} + \frac{Uj}{2} + V_{safeguard},$$

which generates 505.4 mV using the exemplary numbers described above where $V_{safeguard}$ corresponds to 50 mV. $V_{safeguard}$ may represent a voltage value to place the $V_{REF}$ well away from E2. The auto-referenced read may generate a time delay (e.g., $\Delta T$) corresponding to $\Delta V$ by using a constant slope of the read voltage (e.g., 20 mV/nsec) and determine the time delay to be 25.3 nsec. The auto-referenced read may maintain the increasing read voltage and detect additional memory cells switching (e.g., the memory cells represented in group 425 described with reference to FIG. 4B) during ΔT duration. It should be appreciated that the half-width of distribution 620 (e.g., N×$\sigma_{SET}$) may contribute significantly to ΔV (e.g., 354 mV out of 505 mV). Thus, the auto-referenced read takes into account the standard deviation of the distribution 620 to determine a reliable read reference point.

At time $T_{E2}$, a SET cell having a maximum threshold voltage value out of distribution 620 may turn on as the read voltage may exceed the maximum threshold voltage value of the memory cell. The auto-referenced read may continue to increase the read voltage as the ΔT duration is not expired, yet. At time $T_{REF}$, the auto-referenced read may stop applying the read voltage to the memory cells as the ΔT duration expires and may determine that all the memory cells that have turned on at the end of ΔT duration are the memory cells having the logic state of 1 (e.g., SET cells). The auto-referenced read may also determine that all the memory cells that have not turned on at the end of ΔT duration (e.g., a memory cell with a lowest threshold voltage of the distribution 640 denoted as E3) are the memory cells having the logic state of 0 (e.g., RESET cells).

In sum, the auto-referenced read may determine a particular smallest threshold voltage value (e.g., jth switching event) to be close to a median threshold voltage of the distribution 620 (e.g., SET cells of the encoded user data). Such determination may be accomplished based on a predetermined factor associated with a weight (e.g., a number of memory cells having the logic state of 1) and an interval that the weight has to meet for the encoded user data in light of properties of order statistics. When the auto-referenced read detects the jth switching event, the auto-referenced read may continue to increase the read voltage during a predetermined period of time to detect additional switching events. The predetermined period of time may account for a standard deviation of the distribution 620 and additional factors described above (e.g., the uncertainty associated with determining the jth switching event, $V_{safeguard}$). When the predetermined period of time expires, the auto-referenced read may determine all the memory cells that have switched belong to the distribution 620 (e.g., SET cells of the encoded user data). Consequently, the auto-referenced read may determine remaining memory cells that have not switched belong to the distribution 640 (e.g., RESET cells of the encoded user data).

Figure 7:
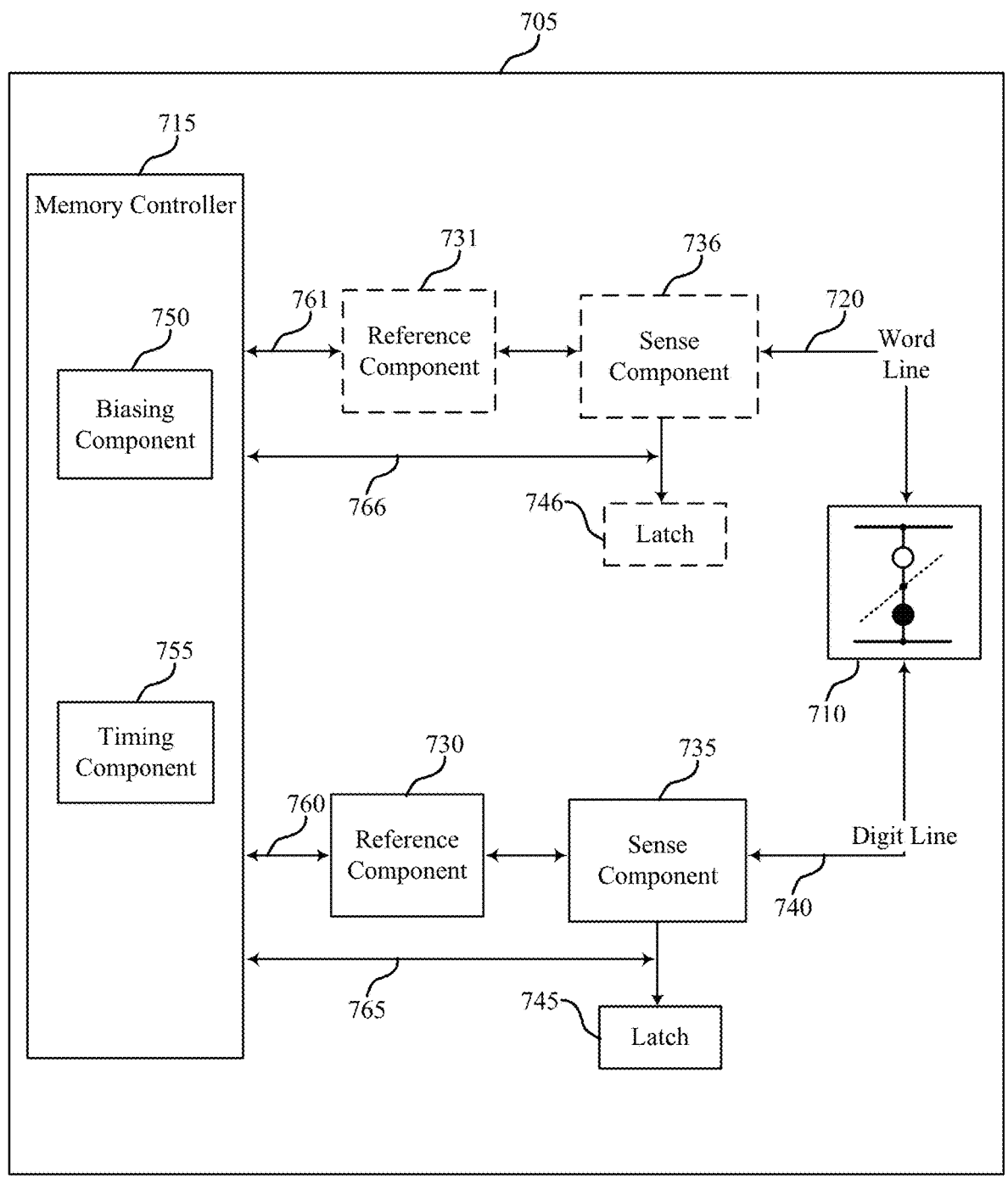
FIGS. 7 and 8 show block diagrams of a device that supports auto-referenced memory cell read techniques in accordance with embodiments of the present disclosure.

FIG. 7 shows a block diagram 700 of a memory array 705 that supports auto-referenced memory cell read techniques in accordance with embodiments of the present disclosure. The memory array 705 may be referred to as an electronic memory apparatus, and may be an example of a component of a memory device 100 as described herein.

The memory array 705 may include one or more memory cells 710, a memory controller 715, a word line 720, a reference component 730, a sense component 735, a digit line 740, and a latch 745. These components may be in electronic communication with each other and may perform one or more of the functions described herein. In some cases, the memory cells 710 may include 3DXP memory cells. In some cases, the memory controller 715 may include a biasing component 750 and a timing component 755. In some cases, a sense component 735 may serve as the reference component 730. In other cases, the reference component 730 may be optional. Also, FIG. 7 shows an alternative schematic option of arranging a sense component 736, a latch 746, and a reference component 731 (in dashed boxes). An ordinary person skilled in the art would appreciate that the sense component and the associated components (i.e., the latch and the reference component) may be associated either with a column decoder or a row decoder without losing their functional purposes.

The memory controller 715 may be in electronic communication with the word line 720, the digit line 740, and the sense component 735, which may be examples of the word line 110, the digit line 115, and the sense component 125 described with reference to FIGS. 1 and 2. The components of the memory array 705 may be in electronic communication with each other and may perform aspects of the functions described with reference to FIGS. 1 through 6. In some cases, the reference component 730, the sense component 735, and the latch 745 may be components of the memory controller 715.

In some embodiments, the digit line 740 is in electronic communication with the sense component 735 and a memory cell 710. The memory cell 710 may be writable with a logic state (e.g., a first, second, or third logic state). The word line 720 may be in electronic communication with the memory controller 715 and the memory cell 710. The sense component 735 may be in electronic communication with the memory controller 715, the digit line 740, the latch 745, and the reference line 760. The reference component 730 may be in electronic communication with the memory controller 715 and the reference line 760. A sense control line 765 may be in electronic communication with the sense component 735 and the memory controller 715. These components may also be in electronic communication with other components, both inside and outside of the memory array 705, in addition to components not listed above, via other components, connections, or buses.

The memory controller 715 may be configured to energize the word line 720 or the digit line 740 by applying voltages to those various nodes. For example, the biasing component 750 may be configured to apply a voltage to operate the memory cell 710 to read or write the memory cell 710 as described above. In some cases, the memory controller 715 may include a row decoder, a column decoder, or both, as described herein. This may enable the memory controller 715 to access one or more memory cells 105 as illustrated with reference to FIG. 1. The biasing component 750 may also provide voltage to the reference component 730 in order to generate a reference signal for the sense component 735. Additionally, the biasing component 750 may provide voltages for the operation of the sense component 735.

In some embodiments, the memory controller 715 may perform its operations using the timing component 755. For example, the timing component 755 may control the timing of the various word line selections or bit line biasing, including timing for switching and voltage application to perform the memory functions, such as reading and writing, discussed herein. In some cases, the timing component 755 may control the operations of the biasing component 750.

The reference component 730 may include various components to generate a reference signal for the sense component 735. The reference component 730 may include circuitry configured to produce a reference signal. In some cases, the reference component 730 may be implemented using other 3DXP memory cells. The sense component 735 may compare a signal from the memory cell 710 (through the digit line 740) with a reference signal from the reference component 730. Upon determining the logic state, the sense component may then store the output in the latch 745, where it may be used in accordance with the operations of an electronic device that the memory array 705 is a part. The sense component 735 may include a sense amplifier in electronic communication with the latch 745 and the memory cell 710.

The memory controller 715 and/or at least some of its various sub-components may be implemented in hardware, software executed by a processor, firmware, or any combination thereof. If implemented in software executed by a processor, the functions of the memory controller 715 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 715 and/or at least some of its various sub-components may be physically located at various positions, including being distributed such that portions of functions are implemented at different physical locations by one or more physical devices. In some embodiments, the memory controller 715 and/or at least some of its various sub-components may be a separate and distinct component in accordance with various embodiments of the present disclosure. In other examples, the memory controller 715 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

The memory controller 715 may receive a first set of bits of an input vector from a host device (not shown), compare at least a portion of the first set of bits that have a first logic value to a threshold stored at the controller, allocate a block of memory to store one or more bits and the first set of bits based on the comparing, generate a second set of bits that includes at least some of the first set of bits and the one or more bits, and initiate storing the generated second set of bits in the block of memory. The memory controller 715 may also apply an activation voltage to a memory array to activate a group of memory cells of the memory array, determine, at a first time, that a first set of memory cells has been activated based on applying the activation voltage, maintain application of the activation voltage for a duration after the first time, and read, after an end of the duration, a logic state of a second set of memory cells that includes the first set of memory cells.

Figure 8:
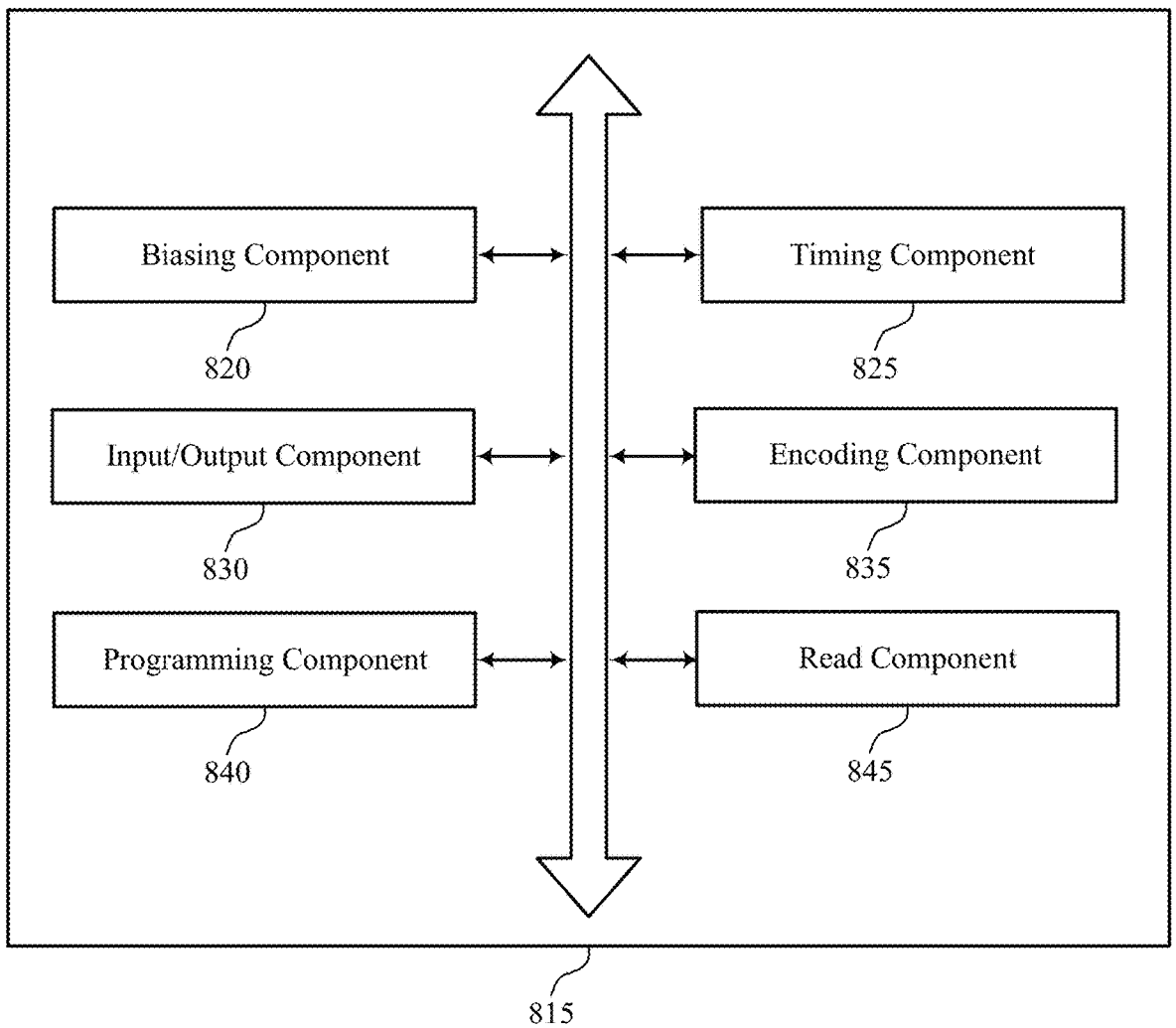

FIG. 8 shows a block diagram 800 of a memory controller 815 that supports auto-referenced memory cell read techniques in accordance with embodiments of the present disclosure. The memory controller 815 may be an example of aspects of a memory controller 715 and 915 described with reference to FIGS. 7 and 9. The memory controller 815 may include biasing component 820, timing component 825, input/output component 830, encoding component 835, programming component 840, and read component 845. Each of these modules may communicate, directly or indirectly, with one another (e.g., via one or more buses).

In some embodiment, the biasing component 820 may apply an activation voltage to a memory array to activate a group of memory cells of the memory array. In some embodiments, the biasing component 820 may also maintain application of the activation voltage for a duration.

In some embodiment, the input/output component 830 may receive a first set of bits of an input vector from a host device (not shown).

In some embodiment, the encoding component 835 may compare at least a portion of the first set of bits that have a first logic value to a threshold stored at the controller and determine a pattern weight of the input vector based on a number of bits having a first logic state, the first logic state associated with a first set of threshold voltages of memory cells, where the first set of threshold voltages is less than a second set of threshold voltages associated with a second logic state different from the first logic state. In some embodiments, the encoding component 835 may also divide the first set of bits into one or more bit segments based on a factor associated with the threshold, select at least one bit segment of the one or more bit segments, and invert a logic state of a set of bits of the selected at least one bit segment, where a value of the one or more bits is based on the inverted logic state of the set of bits.

In some embodiments, the encoding component 835 may determine a number of bit segments of the one or more bit segments based on the factor, where a number of the one or more bits corresponds to the number of bit segments, generate a second set of bits that includes at least some of the first set of bits and the one or more bits, invert respective logic states of the first set of bits based on the determination that the number of the first set of bits does not satisfy the threshold, and determine that the number of the first set of bits does not satisfy the threshold based on inverting the respective logic states of the first set of bits. In some embodiment, the encoding component 835 may restore original logic states of the first set of bits based on the determination that the number of the first set of bits does not satisfy the threshold after the inversion, compare a different portion of the first set of bits that have the first logic value to the threshold stored at the controller, and compare the percentage, to a percentage range, the percentage range based on a factor associated with the threshold.

In some cases, comparing at least the portion of the first set of bits includes identifying a percentage of bits of the input vector having a first logic state. In some cases, comparing at least the portion of the first set of bits includes: determining that a number of the first set of bits does not satisfy the threshold. In some cases, comparing at least the portion of the first set of bits includes: comparing a pattern weight of the input vector to a range that is based on a factor associated with the threshold.

In some embodiments, the programming component 840 may allocate a block of memory to store one or more bits and the first set of bits based on the comparing. In some embodiments, the programming component 840 may initiate storing the generated second set of bits in the block of memory.

In some embodiments, the read component 845 may determine, at a first time, that a first set of memory cells has been activated based on applying the activation voltage, and read, after an end of the duration, a logic state of a second set of memory cells that includes the first set of memory cells. In some embodiments, the read component 845 may determine that the second set of memory cells corresponds to a first logic state. In some cases, the read component 845 may also determine that a third set of memory cells corresponds to a second logic state different from a first logic state, where the third set of memory cells are inactive after the end of the duration.

Figure 9:
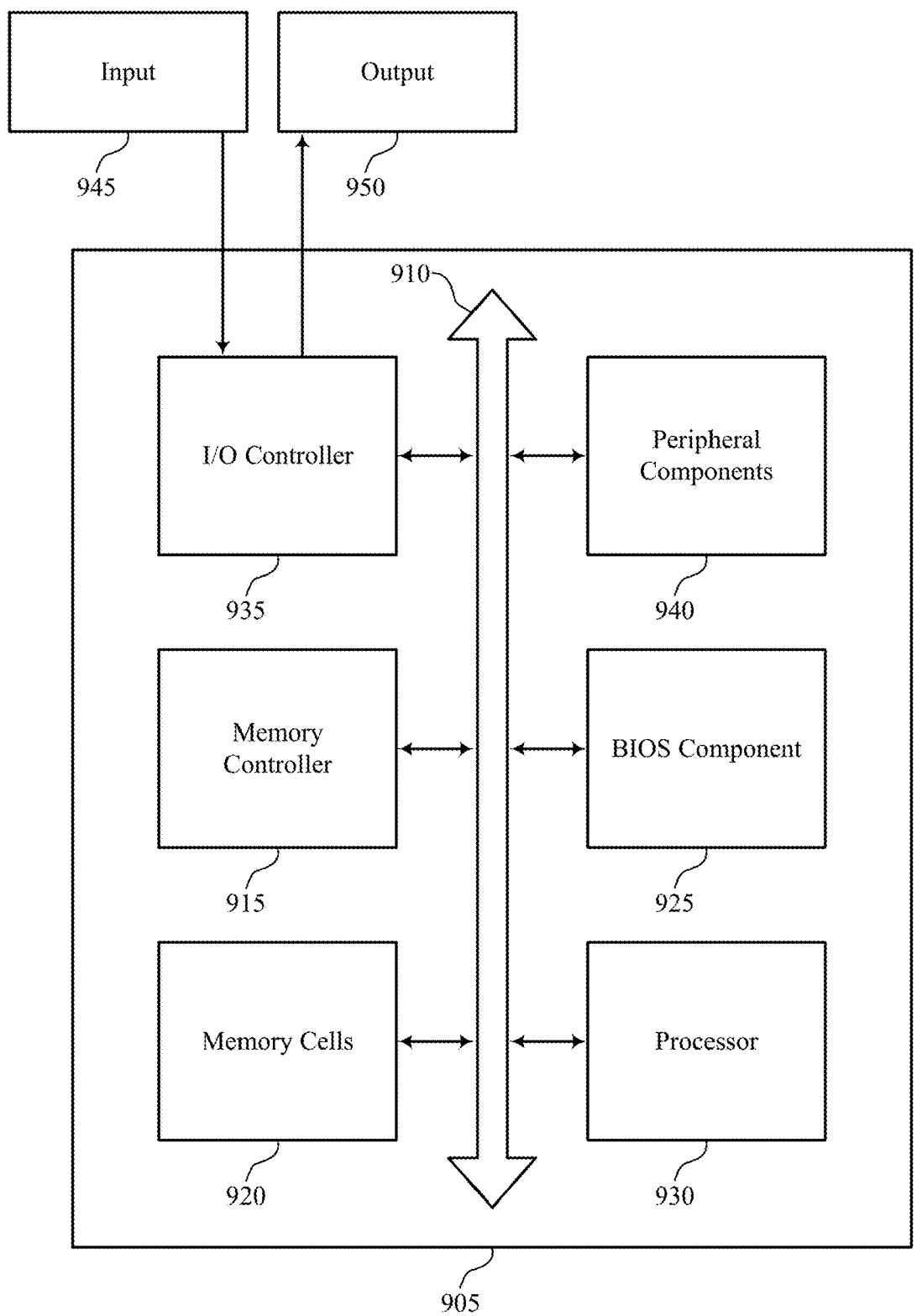
FIG. 9 illustrates a block diagram of a system including a memory array that supports auto-referenced memory cell read techniques in accordance with embodiments of the present disclosure.

FIG. 9 shows a diagram of a system 900 including a device 905 that supports auto-referenced memory cell read techniques in accordance with embodiments of the present disclosure. The device 905 may be an example of or include the components of memory device 100 as described above, e.g., with reference to FIG. 1. The device 905 may include components for bi-directional voice and data communications including components for transmitting and receiving communications, including a memory controller 915, memory cells 920, a basic input/output system (BIOS) component 925, a processor 930, an I/O controller 935, and peripheral component(s) 940. These components may be in electronic communication via one or more buses (e.g., bus 910).

The memory controller 915 may operate one or more memory cells as described herein. Specifically, the memory controller 915 may be configured to support auto-referenced memory cell read techniques. In some cases, the memory controller 915 is coupled with the cross-point array and operable to perform access operations (e.g., programming or read) as described above with reference to FIG. 8. In some cases, the memory controller 915 may receive a first set of bits of an input vector from a host device (not shown), compare at least a portion of the first set of bits that have a first logic value to a threshold stored at the controller, allocate a block of memory to store one or more bits and the first set of bits based on the comparing, generate a second set of bits that includes at least some of the first set of bits and the one or more bits, and initiate storing the generated second set of bits in the block of memory. In some embodiments, the memory controller 915 may also apply an activation voltage to a memory array to activate a group of memory cells of the memory array, determine, at a first time, that a first set of memory cells has been activated based on applying the activation voltage, maintain application of the activation voltage for a duration after the first time, and read, after an end of the duration, a logic state of a second set of memory, cells that includes the first set of memory cells.

The memory cells 920 may store information (i.e., in the form of a logical state) as described herein. In some embodiments, the memory cells 920 may include a cross-point memory array comprising 3DXP memory cells. The memory cells 920 may also be referred to as a memory medium. In some cases, the memory medium may include a three-dimensional cross-point array of phase change memory cells.

The BIOS component 925 be a software component that includes BIOS operated as firmware, which may initialize and run various hardware components. The BIOS component 925 may also manage data flow between a processor and various other components, e.g., peripheral components, input/output control component, etc. The BIOS component 925 may include a program or software stored in read only memory (ROM), flash memory, or any other non-volatile memory.

The processor 930 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, the processor 930 may be configured to operate a memory array using a memory controller. In other cases, a memory controller may be integrated into the processor 930. The processor 930 may be configured to execute computer-readable instructions stored in a memory to perform various functions (e.g., functions or tasks supporting auto-referenced memory cell read techniques).

The I/O controller 935 may manage input and output signals for the device 905. The I/O controller 935 may also manage peripherals not integrated into the device 905. In some cases, the I/O controller 935 may represent a physical connection or port to an external peripheral. In some cases, the I/O controller 935 may utilize an operating system such as iOS®, ANDROID®, MS-DOS®, MS-WINDOWS®, OS/2®, UNIX®, LINUX®, or another known operating system. In other cases, the I/O controller 935 may represent or interact with a modem, a keyboard, a mouse, a touchscreen, or a similar device. In some cases, the I/O controller 935 may be implemented as part of a processor. In some cases, a user may interact with the device 905 via the I/O controller 935 or via hardware components controlled by the I/O controller 935.

The peripheral component(s) 940 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

The input device 945 may represent a device or signal external to the device 905 that provides input to the device 905 or its components. This may include a user interface or an interface with or between other devices. In some cases, the input 945 may be managed by the I/O controller 935, and may interact with the device 905 via the peripheral component(s) 940.

The output device 950 may also represent a device or signal external to the device 905 configured to receive output from the device 905 or any of its components. Examples of the output 950 may include a display, audio speakers, a printing device, another processor or printed circuit board, etc. In some cases, the output 950 may be a peripheral element that interfaces with the device 905 via the peripheral component(s) 940. In some cases, the output 950 may be managed by the I/O controller 935.

The components of the device 905 may include circuitry designed to carry out their functions. This may include various circuit elements, for example, conductive lines, transistors, capacitors, inductors, resistors, amplifiers, or other active or inactive elements, configured to carry out the functions described herein. The device 905 may be a computer, a server, a laptop computer, a notebook computer, a tablet computer, a mobile phone, a wearable electronic device, a personal electronic device, or the like. Or the device 905 may be a portion or aspect of such a device.

Figure 10:
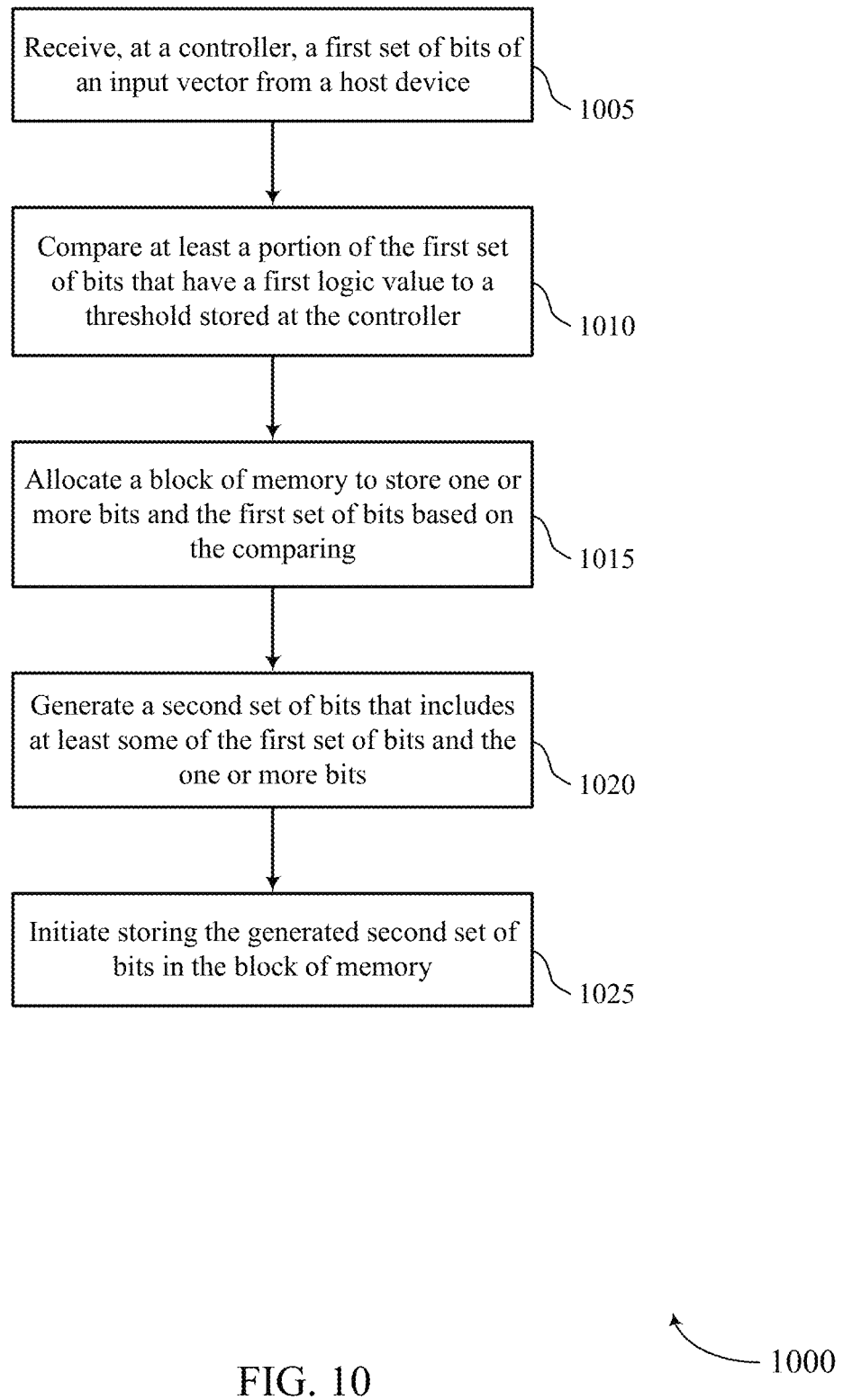
FIGS. 10 and 11 illustrate methods for auto-referenced memory cell read techniques in accordance with embodiments of the present disclosure.

FIG. 10 shows a flowchart illustrating a method 1000 for auto-referenced memory cell read techniques with embodiments of the present disclosure. The operations of method 1000 may be implemented by a memory device 100 or its components as described herein. For example, the operations of method 1000 may be performed by a memory controller as described with reference to FIGS. 1 and 7 through 9. In some embodiments, the memory device 100 may execute a set of codes to control the functional elements of the device to perform the functions described below. Additionally or alternatively, the memory device 100 may perform aspects of the functions described below using special-purpose hardware.

At block 1005 the memory device 100 may receive, at a controller, a first set of bits of an input vector from a host device. The operations of block 1005 may be performed according to the methods described herein. In certain examples, aspects of the operations of block 1005 may be performed by an input/output component as described with reference to FIGS. 7 through 9.

At block 1010 the memory device 100 may compare at least a portion of the first set of bits that have a first logic value to a threshold stored at the controller. The operations of block 1010 may be performed according to the methods described herein. In certain examples, aspects of the operations of block 1010 may be performed by an encoding component as described with reference to FIGS. 7 through 9.

At block 1015 the memory device 100 may allocate a block of memory to store one or more bits and the first set of bits based at least in part on the comparing. The operations of block 1015 may be performed according to the methods described herein. In certain examples, aspects of the operations of block 1015 may be performed by a programming component as described with reference to FIGS. 7 through 9.

At 1020 the memory device 100 may generate a second set of bits that comprises at least some of the first set of bits and the one or more bits. The operations of 1020 may be performed according to the methods described herein. In certain examples, aspects of the operations of 1020 may be performed by a encoding component as described with reference to FIGS. 7 through 9.

At 1025 the memory device 100 may initiate storing the generated second set of bits in the block of memory. The operations of 1025 may be performed according to the methods described herein. In certain examples, aspects of the operations of 1025 may be performed by a programming component as described with reference to FIGS. 7 through 9.

In some embodiments, the method 1000 may also include dividing the first set of bits into one or more bit segments based at least in part on a factor associated with the threshold, selecting at least one bit segment of the one or more bit segments, and inverting a logic state of a set of bits of the selected at least one bit segment, where a value of the one or more bits is based at least in part on the inverted logic state of the set of bits. In some embodiments, the method 1000 may also include determining a number of bit segments of the one or more bit segments based at least in part on the factor, where a number of the one or more bits corresponds to the number of bit segments. In some embodiments, the method 1000 may also include identifying a percentage of bits of the input vector having a first logic state and comparing the percentage to a percentage range, the percentage range based at least in part on a factor associated with the threshold.

In some embodiments, the method 1000 may also include determining that a number of the first set of bits does not satisfy the threshold and inverting respective logic states of the first set of bits based at least in part on the determination that the number of the first set of bits does not satisfy the threshold. In some embodiments, the method 1000 may also include determining that the number of the first set of bits does not satisfy the threshold based at least in part on inverting the respective logic states of the first set of bits, restoring original logic states of the first set of bits based on the determination that the number of the first set of bits does not satisfy the threshold after the inversion, and comparing a different portion of the first set of bits that have the first logic value to the threshold stored at the controller. In some embodiments, the method 1000 may also include comparing a pattern weight of the input vector to a range that is based at least in part on a factor associated with the threshold. In some embodiments, the method 1000 may also include determining a pattern weight of the input vector based at least in part on a number of bits having a first logic state, the first logic state associated with a first set of threshold voltages of memory cells, where the first set of threshold voltages is less than a second set of threshold voltages associated with a second logic state different from the first logic state.

In some embodiments, an apparatus for auto-referenced memory cell read techniques is described. The apparatus may include means for receiving, at a controller, a first set of bits of an input vector from a host device, means for comparing at least a portion of the first set of bits that have a first logic value to a threshold stored at the controller, means for allocating a block of memory to store one or more bits and the first set of bits based at least in part on the comparing, means for generating a second set of bits that comprises at least some of the first set of bits and the one or more bits, and means for initiating storing the generated second set of bits in the block of memory.

In some embodiments, the apparatus may also include means for dividing the first set of bits into one or more bit segments based at least in part on a factor associated with the threshold, means for selecting at least one bit segment of the one or more bit segments, and means for inverting a logic state of a set of bits of the selected at least one bit segment, where a value of the one or more bits is based at least in part on the inverted logic state of the set of bits. In some embodiments, the apparatus may also include means for determining a number of bit segments of the one or more bit segments based at least in part on the factor, where a number of the one or more bits corresponds to the number of bit segments. In some embodiments, the apparatus may also include means for identifying a percentage of bits of the input vector having a first logic state and means for comparing the percentage to a percentage range, the percentage range based at least in part on a factor associated with the threshold.

In some embodiments, the apparatus may also include means for determining that a number of the first set of bits does not satisfy the threshold and means for inverting respective logic states of the first set of bits based at least in part on the determination that the number of the first set of bits does not satisfy the threshold. In some embodiments, the apparatus may also include means for determining that the number of the first set of bits does not satisfy the threshold based at least in part on inverting the respective logic states of the first set of bits, means for restoring original logic states of the first set of bits based on the determination that the number of the first set of bits does not satisfy the threshold after the inversion, and means for comparing a different portion of the first set of bits that have the first logic value to the threshold stored at the controller. In some embodiments, the apparatus may also include means for comparing a pattern weight of the input vector to a range that is based at least in part on a factor associated with the threshold. In some embodiments, the apparatus may also include means for determining a pattern weight of the input vector based at least in part on a number of bits having a first logic state, the first logic state associated with a first set of threshold voltages of memory cells, where the first set of threshold voltages is less than a second set of threshold voltages associated with a second logic state different from the first logic state.

Figure 11:
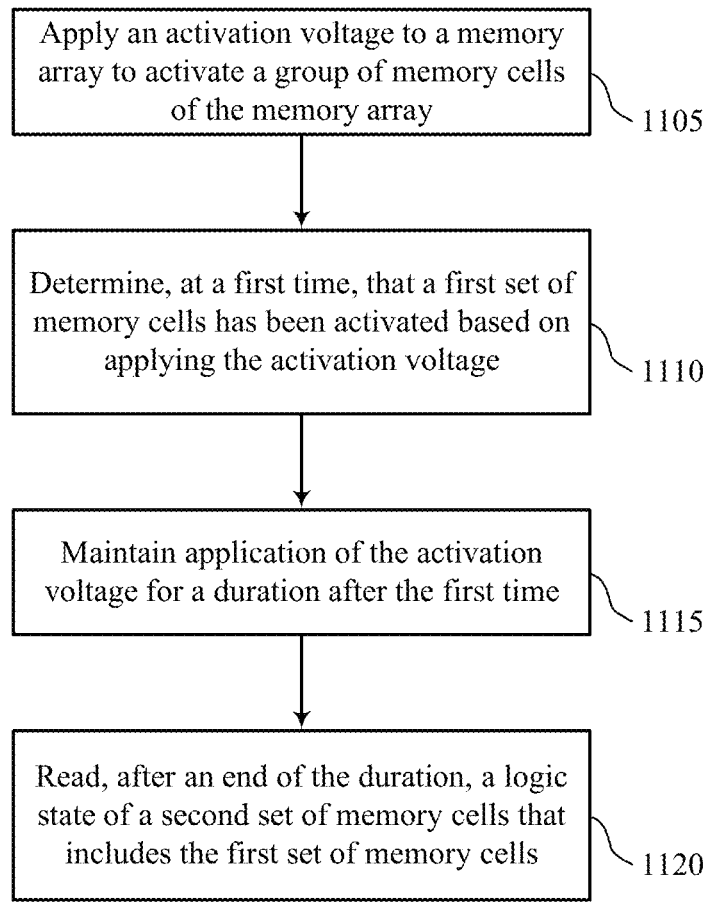

FIG. 11 shows a flowchart illustrating a method 1100 for auto-referenced memory cell read techniques in accordance with embodiments of the present disclosure. The operations of method 1100 may be implemented by a memory device 100 or its components as described herein. For example, the operations of method 1100 may be performed by a memory controller as described with reference to FIGS. 1 and 7 through 9. In some embodiments, the memory device 100 may execute a set of codes to control the functional elements of the device to perform the functions described below. Additionally or alternatively, the memory device 100 may perform aspects of the functions described below using special-purpose hardware.

At block 1105 the memory device 100 may apply an activation voltage to a memory array to activate a group of memory cells of the memory array. The operations of block 1105 may be performed according to the methods described herein. In certain examples, aspects of the operations of block 1105 may be performed by a biasing component as described with reference to FIGS. 7 through 9.

At block 1110 the memory device 100 may determine, at a first time, that a first set of memory cells has been activated based at least in part on applying the activation voltage. The operations of block 1110 may be performed according to the methods described herein. In certain examples, aspects of the operations of block 1110 may be performed by a read component as described with reference to FIGS. 7 through 9.

At block 1115 the memory device 100 may maintain application of the activation voltage for a duration after the first time. The operations of block 1115 may be performed according to the methods described herein. In certain examples, aspects of the operations of block 1115 may be performed by a biasing component as described with reference to FIGS. 7 through 9.

At block 1120 the memory device 100 may read, after an end of the duration, a logic state of a second set of memory cells that includes the first set of memory cells. The operations of block 1120 may be performed according to the methods described herein. In certain examples, aspects of the operations of block 1120 may be performed by a read component as described with reference to FIGS. 7 through 9.

In some cases, the method 1100 may include determining that the second set of memory cells corresponds to a first logic state. In some cases, the determination that the first set of memory cells has been activated is based on a median threshold voltage value of a subset of the group of memory cells, where threshold voltages of the subset of memory cells are less than threshold voltages of remaining memory cells of the group. In some cases, the duration is determined based on activating additional memory cells, where the second set of memory cells comprises the first set of memory cells and the additional memory cells. In some cases, the activation voltage has an initial value that is less than a smallest threshold voltage of a set of memory cells. In other cases, the activation voltage has an initial value that is greater than a smallest threshold voltage of a set of memory cells and less than a median threshold voltage of the set of memory cells. In some cases, the activation voltage has a constant rate of increase with respect to time. In some embodiments, the method 1100 may also include determining that a third set of memory cells corresponds to a second logic state different from a first logic state, where the third set of memory cells are inactive after the end of the duration.

In some embodiments, an apparatus for auto-referenced memory cell read techniques is described. The apparatus may include means for applying an activation voltage to a memory array to activate a group of memory cells of the memory array, determining, at a first time, that a first set of memory cells has been activated based at least in part on applying the activation voltage, means for maintaining application of the activation voltage for a duration after the first time, and means for reading, after an end of the duration, a logic state of a second set of memory cells that includes the first set of memory cells. In some cases, the apparatus may also include means for determining that the second set of memory cells corresponds to a first logic state. In some cases, the apparatus may also include means for determining that a third set of memory cells corresponds to a second logic state different from a first logic state, wherein the third set of memory cells are inactive after the end of the duration. In some cases, the apparatus may also include means for determining that the first set of memory cells has been activated based on a median threshold voltage value of a subset of the group of memory cells, where threshold voltages of the subset of memory cells are less than threshold voltages of remaining memory cells of the group.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory device 100.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including a memory device 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques: These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving, at a controller, a first set of bits of an input vector from a host device;
   comparing at least a portion of the first set of bits that have a first logic value to a threshold stored at the controller;
   allocating a block of memory to store one or more bits and the first set of bits based at least in part on the comparing;
   generating a second set of bits that comprises at least some of the first set of bits and the one or more bits; and
   storing the generated second set of bits in the block of memory.

2. The method of claim 1, further comprising:
   dividing the first set of bits into one or more bit segments based at least in part on a factor associated with the threshold;
   selecting at least one bit segment of the one or more bit segments; and
   inverting a logic state of a set of bits of the selected at least one bit segment, wherein a value of the one or more bits is based at least in part on the inverted logic state of the set of bits.

3. The method of claim 2, further comprising:
   determining a number of bit segments of the one or more bit segments based at least in part on the factor, wherein a number of the one or more bits corresponds to the number of bit segments.

4. The method of claim 1, wherein comparing at least the portion of the first set of bits comprises:
   identifying a percentage of bits of the input vector having a first logic state; and
   comparing the percentage to a percentage range, the percentage range based at least in part on a factor associated with the threshold.

5. The method of claim 1, wherein comparing at least the portion of the first set of bits comprises:
   determining that a number of the first set of bits does not satisfy the threshold; and
   inverting respective logic states of the first set of bits based at least in part on the determination that the number of the first set of bits does not satisfy the threshold.

6. The method of claim 5, further comprises:
   determining that the number of the first set of bits does not satisfy the threshold based at least in part on inverting the respective logic states of the first set of bits;
   restoring original logic states of the first set of bits based on the determination that the number of the first set of bits does not satisfy the threshold after the inversion; and
   comparing a different portion of the first set of bits that have the first logic value to the threshold stored at the controller.

7. The method of claim 1, wherein comparing at least the portion of the first set of bits comprises:
   comparing a pattern weight of the input vector to a range that is based at least in part on a factor associated with the threshold.

8. The method of claim 1, further comprising:
   determining a pattern weight of the input vector based at least in part on a number of bits having a first logic state, the first logic state associated with a first set of threshold voltages of memory cells, wherein the first set of threshold voltages is less than a second set of threshold voltages associated with a second logic state different from the first logic state.

9. An electronic memory apparatus, comprising:
   a memory medium;
   a controller coupled with the memory medium, wherein the controller is operable to:
   receive a first set of bits of an input vector from a host device;
   compare at least a portion of the first set of bits that have a first logic value to a threshold stored at the controller;
   allocate a block of memory of the memory medium to store one or more bits and the first set of bits based at least in part on the comparing;
   generate a second set of bits that comprises at least some of the first set of bits and the one or more bits; and
   store the generated second set of bits in the block of memory.

10. The electronic memory apparatus of claim 9, wherein the controller is further operable to:
    divide the first set of bits into one or more bit segments based at least in part on a factor associated with the threshold;
    select at least one bit segment of the one or more bit segments; and invert a logic state of a set of bits of the selected at least one bit segment, wherein a value of the one or more bits is based at least in part on the inverted logic state of the set of bits.

11. The electronic memory apparatus of claim 9, wherein the controller is further operable to:
identify a percentage of bits of the input vector having a first logic state; and
compare the percentage to a percentage range, the percentage range based at least in part on a factor associated with the threshold.

12. The electronic memory apparatus of claim 9, wherein the controller is further operable to:
determine that a number of the first set of bits does not satisfy the threshold; and
invert respective logic states of the first set of bits based at least in part on the determination that the number of the first set of bits does not satisfy the threshold.

13. The electronic memory apparatus of claim 9, wherein the controller is further operable to:
compare a pattern weight of the input vector to a range, the range based at least in part on a factor associated with the threshold.

14. The electronic memory apparatus of claim 9, wherein the memory medium comprises a three-dimensional cross-point array of phase change memory cells.

15. An apparatus, comprising:
a transceiver configured to receive a first set of bits of an input vector;
an encoder coupled with the transceiver and configured to:
generate a second set of bits that includes at least some of the first set of bits and one or more additional bits; and
compare at least a portion of the first set of bits to a threshold, the comparison based at least in part on the first set of bits having a first logic value; and
a programming component coupled with the encoder and configured to store the second set of bits in a block of memory that is allocated based at least in part on the comparison.

16. The apparatus of claim 15, wherein the encoder is configured to:
divide the first set of bits into one or more portions based at least in part on a factor associated with the threshold;
select at least one portion of the one or more portions; and
invert a logic state of bits of the at least one portion, wherein respective logic states the one or more additional bits is based at least in part on the inverted logic state of the bits.

17. The apparatus of claim 16, wherein the encoder is configured to:
determine a number of the one or more portions based at least in part on the factor, wherein a number of the one or more additional bits corresponds to the number of the one or more portions.

18. The apparatus of claim 15, wherein the encoder is configured to:
identify, within the first set of bits, a ratio of bits that have a first logic state and a total number of bits of the first set of bits; and
compare the ratio of bits to a range of ratios, the range of ratios being based at least in part on a factor associated with the threshold.

19. The apparatus of claim 15, wherein the encoder is configured to:
determine that a subset of bits of the first set of bits does not satisfy the threshold;
invert respective logic states of the first set of bits based at least in part on the determination that the subset of bits does not satisfy the threshold;
restore original logic states of the first set of bits based on a determination that the subset of bits does not satisfy the threshold after the inversion.

20. The apparatus of claim 15, wherein the encoder is configured to:
adjust logic states for respective bits of the one or more additional bits based at least in part on a determination that a corresponding portion of the first set of bits does not satisfy the threshold after respective logic states of the first set of bits are inverted.

* * * * *